United States Patent
Kanda et al.

(10) Patent No.: US 10,681,286 B2
(45) Date of Patent: Jun. 9, 2020

(54) IMAGE PROCESSING APPARATUS, IMAGING APPARATUS, IMAGE PROCESSING METHOD, AND RECORDING MEDIUM

(71) Applicant: CANON KABUSHIKI KAISHA, Tokyo (JP)

(72) Inventors: Akihiko Kanda, Kawasaki (JP); Koichi Fukuda, Tokyo (JP); Yuki Yoshimura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/878,526

(22) Filed: Jan. 24, 2018

(65) Prior Publication Data
US 2018/0213161 A1 Jul. 26, 2018

(30) Foreign Application Priority Data

Jan. 26, 2017 (JP) .................. 2017-012065
Mar. 7, 2017 (JP) .................. 2017-043064

(51) Int. Cl.
| | | |
|---|---|---|
| H04N 5/265 | (2006.01) | |
| H04N 5/232 | (2006.01) | |
| G06F 3/0484 | (2013.01) | |
| H01L 27/146 | (2006.01) | |
| G02B 15/20 | (2006.01) | |

(Continued)

(52) U.S. Cl.
CPC ............ *H04N 5/265* (2013.01); *G02B 15/20* (2013.01); *G06F 3/04847* (2013.01); *H01L 27/14621* (2013.01); *H01L 27/14627* (2013.01); *H01L 27/14645* (2013.01); *H04N 5/23212* (2013.01); *H04N 5/23216* (2013.01); *H04N 5/23296* (2013.01); *G03B 9/02* (2013.01);
(Continued)

(58) Field of Classification Search
CPC ........................................ H04N 5/265
USPC ........................................ 348/222.1
See application file for complete search history.

(56) References Cited

U.S. PATENT DOCUMENTS 4,410,804 A 10/1983 Stauffer
9,432,656 B2 8/2016 Tajiri
(Continued)

FOREIGN PATENT DOCUMENTS

| EP | 1 085 751 B1 | 11/2012 |
| JP | 2001-083407 A | 3/2001 |
| JP | 2012-147046 A | 8/2012 |

OTHER PUBLICATIONS

Aaron Isaksen et al. "Dynamically Reparameterized Light Fields," SIGGRAPH'00 Proceedings of the 27th annual conference on Computer graphics and interactive techniques, (USA), 2000, pp. 297-306.

*Primary Examiner* — Joel W Fosselman
(74) *Attorney, Agent, or Firm* — Cowan, Liebowitz & Latman, P.C.

(57) ABSTRACT

An image processing apparatus includes: a memory configured to acquire a plurality of visual point images; a visual point change processing unit configured to perform image processing on image data based on the plurality of visual point images to generate a combination image; an area designation unit configured to designate an area subjected to the image processing using the visual point change process-
(Continued)

ing unit; and an adjustment unit configured to set an adjustable range of the image processing for each area designated by the area designation unit.

15 Claims, 26 Drawing Sheets

(51) Int. Cl.
*G03B 9/02* (2006.01)
*H04N 9/07* (2006.01)
*G03B 15/05* (2006.01)
*G03B 13/36* (2006.01)

(52) U.S. Cl.
CPC .............. *G03B 13/36* (2013.01); *G03B 15/05* (2013.01); *H04N 9/07* (2013.01)

(56) References Cited

U.S. PATENT DOCUMENTS

2008/0131019 A1* 6/2008 Ng ............................ G06T 5/50
 382/255
2012/0176506 A1* 7/2012 Tajiri ................... H04N 5/2254
 348/222.1

* cited by examiner

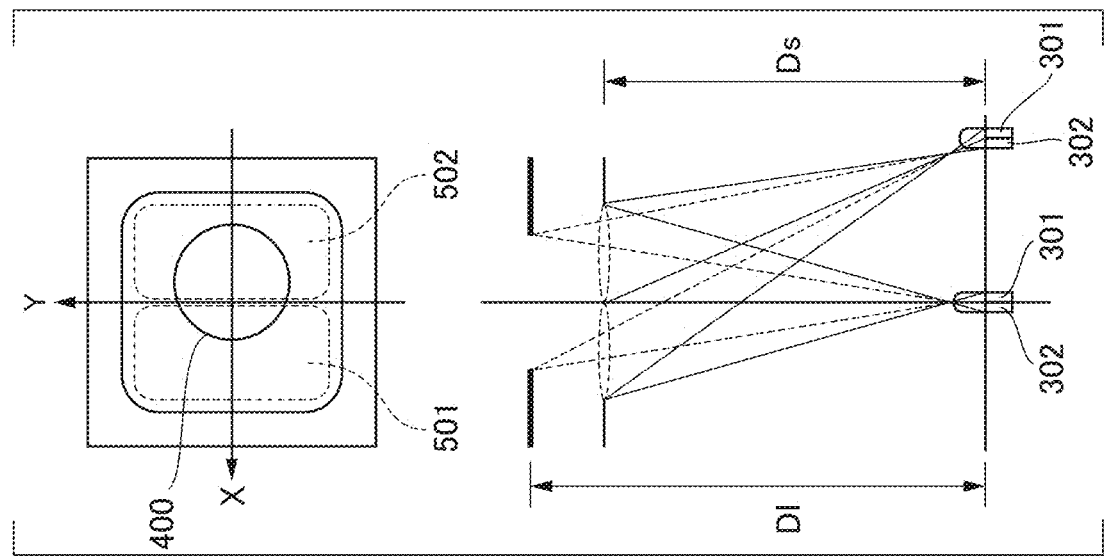
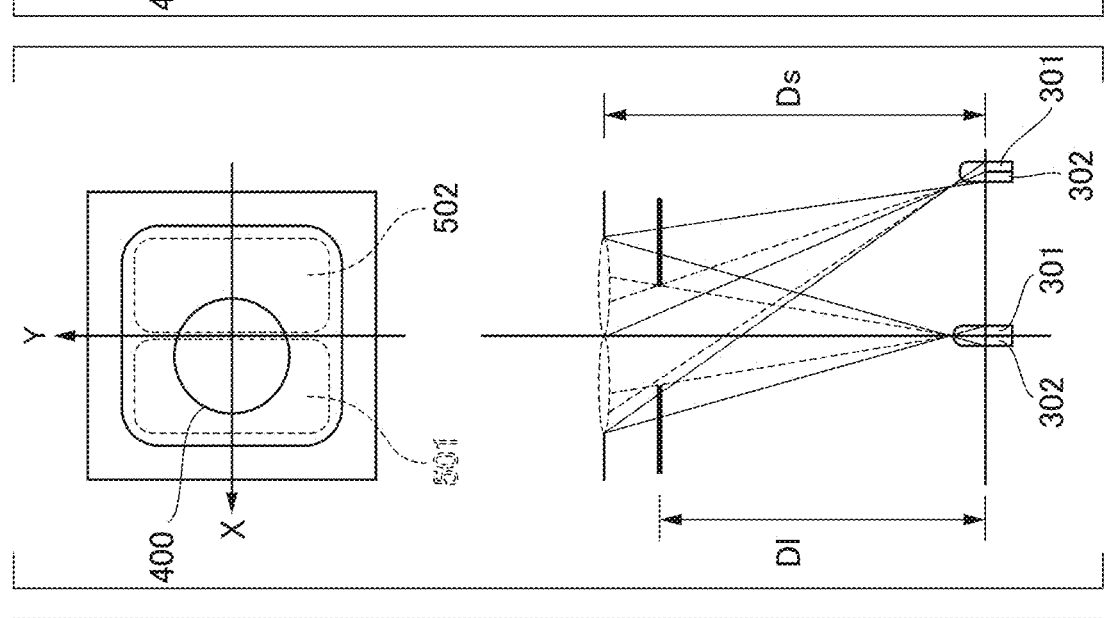
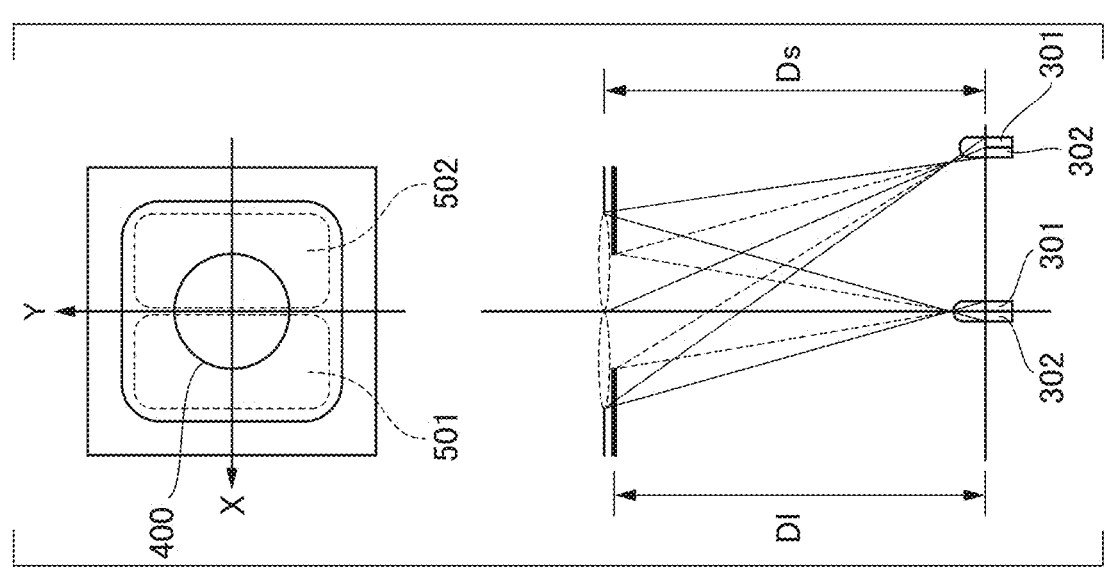

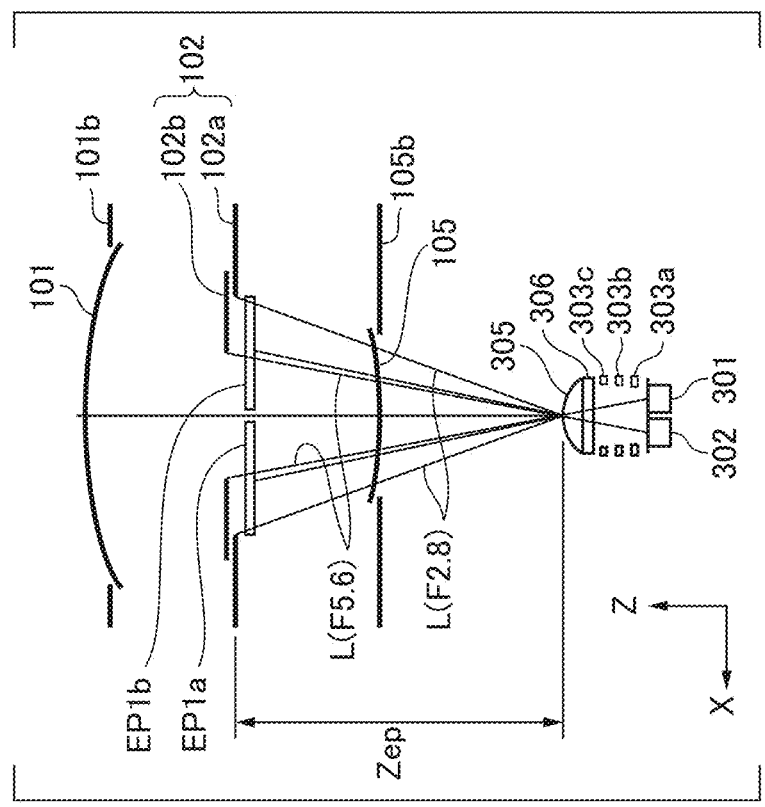
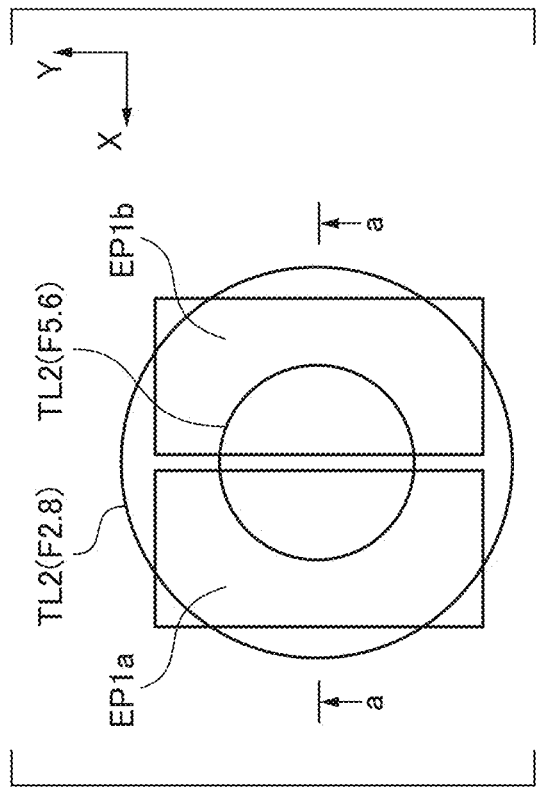
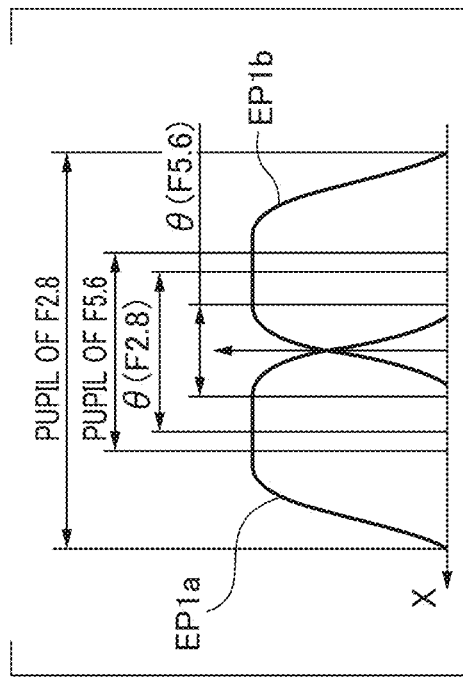

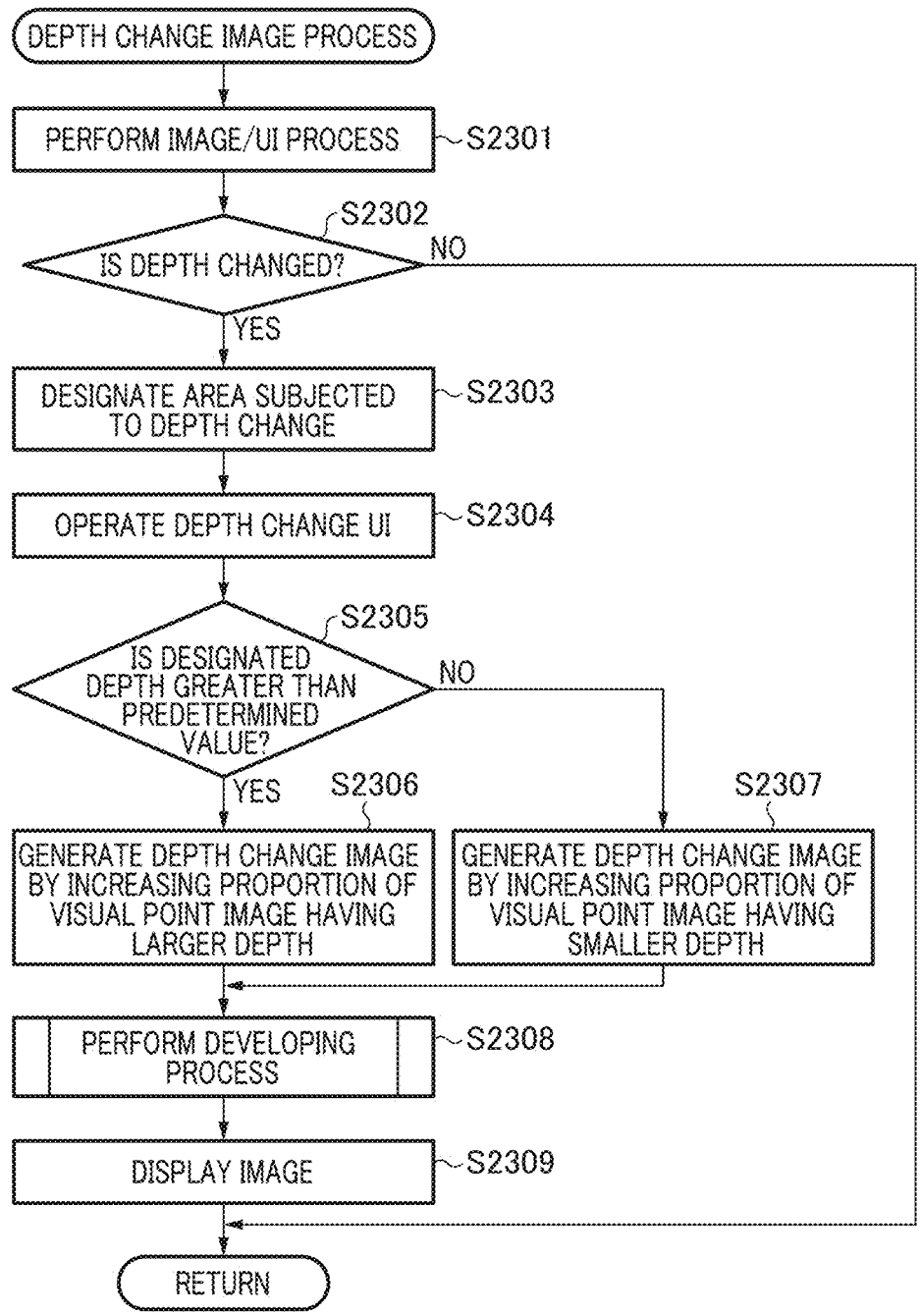

IMAGE PROCESSING APPARATUS, IMAGING APPARATUS, IMAGE PROCESSING METHOD, AND RECORDING MEDIUM

BACKGROUND OF THE INVENTION

Field of the Invention

The present invention relates to an image processing apparatus, an imaging apparatus, an image processing method, and a recording medium.

Description of the Related Art

In the related art, there has been proposed an imaging apparatus capable of pupil-dividing an exit pupil of a photographing lens into a plurality of areas and simultaneously photographing a plurality of visual point images corresponding to the divided pupil areas.

The specification of U.S. Pat. No. 4,410,804 discloses an imaging apparatus using a two-dimensional imaging element in which one microlens and a plurality of divided photoelectric conversion units are formed for one pixel. The plurality of divided photoelectric conversion units are configured to receive light of different pupil partial areas of the exit pupil of the photographing lens through one microlens and pupil-divided. A plurality of visual point images corresponding to the divided pupil partial areas can be generated from signals received by the plurality of divided photoelectric conversion units. Japanese Patent Laid-Open No. 2001-083407 discloses an imaging apparatus configured to generate a captured image by adding all signals received by divided photoelectric conversion units.

A plurality of photographed visual point signals are equivalent to light field data serving as spatial distribution and angular distribution information of a light intensity. Aaron Isaksen, Leonard McMillan, and Steven J. Gortler's "Dynamically reparameterized light fields," SIGGRAPH'00 Proceedings of the 27th annual conference on Computer graphics and interactive techniques, (USA), 2000, p. 297 to 306 discloses a refocusing technique configured to combine an image in a virtual imaging plane different from an imaging surface and a captured image using acquired light field data, thereby changing an in-focus position of the captured image after photographing.

Also, Japanese Patent Laid-Open No. 2012-147046 discloses an imaging apparatus using a two-dimensional imaging element in which one microlens and a plurality of divided photoelectric conversion units are formed in one pixel. The divided photoelectric conversion units are configured to receive light of different pupil partial areas of an exit pupil of a photographing lens through one microlens and pupil-divided. Japanese Patent Laid-Open No. 2012-147046 discloses reduction of parallax through a combination of a plurality of visual point images acquired from the divided photoelectric conversion units.

However, when a combination image in which a visual point is moved is generated, a change in the image unintended by a user such as the occurrence of a blurred image having a blur shape deformed from a perfect circle in a part of a combination image occurs because weights of a plurality of visual point images are changed in some cases.

Also, since each pupil partial area is narrower than the entire area of the exit pupil, an aperture value corresponding to each visual point image is larger (darker) than an aperture value corresponding to the entire exit pupil. Furthermore, an aperture value of each visual point image is different in accordance with an image height due to a pupil shift between an exit pupil of a photographing lens and an entrance pupil of an imaging element in some cases. In the technique disclosed in Japanese Patent Laid-Open No. 2012-147046, a difference in aperture values is not considered when a plurality of visual point images are combined.

SUMMARY OF THE INVENTION

The present invention allows high-quality image processing when a combination image is generated from a plurality of visual point images.

An image processing apparatus according to the present invention includes: an acquisition unit configured to acquire a plurality of visual point images; an image processing unit configured to perform image processing on image data based on the plurality of visual point images to generate a combination image; a designation unit configured to designate an area subjected to the image processing using the image processing unit; and an adjustment unit configured to set an adjustable range of the image processing for each area designated by the designation unit.

Further features of the present invention will become apparent from the following description of exemplary embodiments with reference to the attached drawings.

BRIEF DESCRIPTION OF THE DRAWINGS

FIGS. 11A to 11C are schematic explanatory diagrams of a pupil shift at a peripheral image height of the imaging element.

FIGS. 21A to 21C are diagrams for describing a conjugate relationship between an exit pupil plane of a photographing optical system and a photoelectric conversion unit of the imaging element arranged near a zero image height.

FIG. 23 is a flowchart for describing details of depth change image processing.

DESCRIPTION OF THE EMBODIMENTS

Modes for carrying out the present invention will be described below with reference to the drawings and the like. Note that, while a case in which the present invention is applied to an imaging apparatus such as a digital camera will be described in the following embodiments, the present invention can be widely applied to an image processing apparatus, an information processing apparatus, an electronic apparatus, and the like configured to perform image processing associated with the present invention. Examples of such apparatuses include a mobile phone, a game machine, a tablet terminal, a personal computer, a clock type or glasses type information terminal, a monitoring system, an in-vehicle system, a medical system such as an endoscope, a robot capable of providing an image, and the like. Furthermore, in the following embodiment, a configuration in which an arbitrary apparatus transmits a visual point image and the operation content to a server apparatus having a processing function of a processor or the like on the Internet or a local network and all or a part of the processing performed on a visual point image is performed using the server apparatus may be provided. In this case, an arbitrary apparatus may include a configuration for receiving and displaying the processing result from a server apparatus. The server apparatus may include a virtual machine.

First Embodiment

Figure 1:
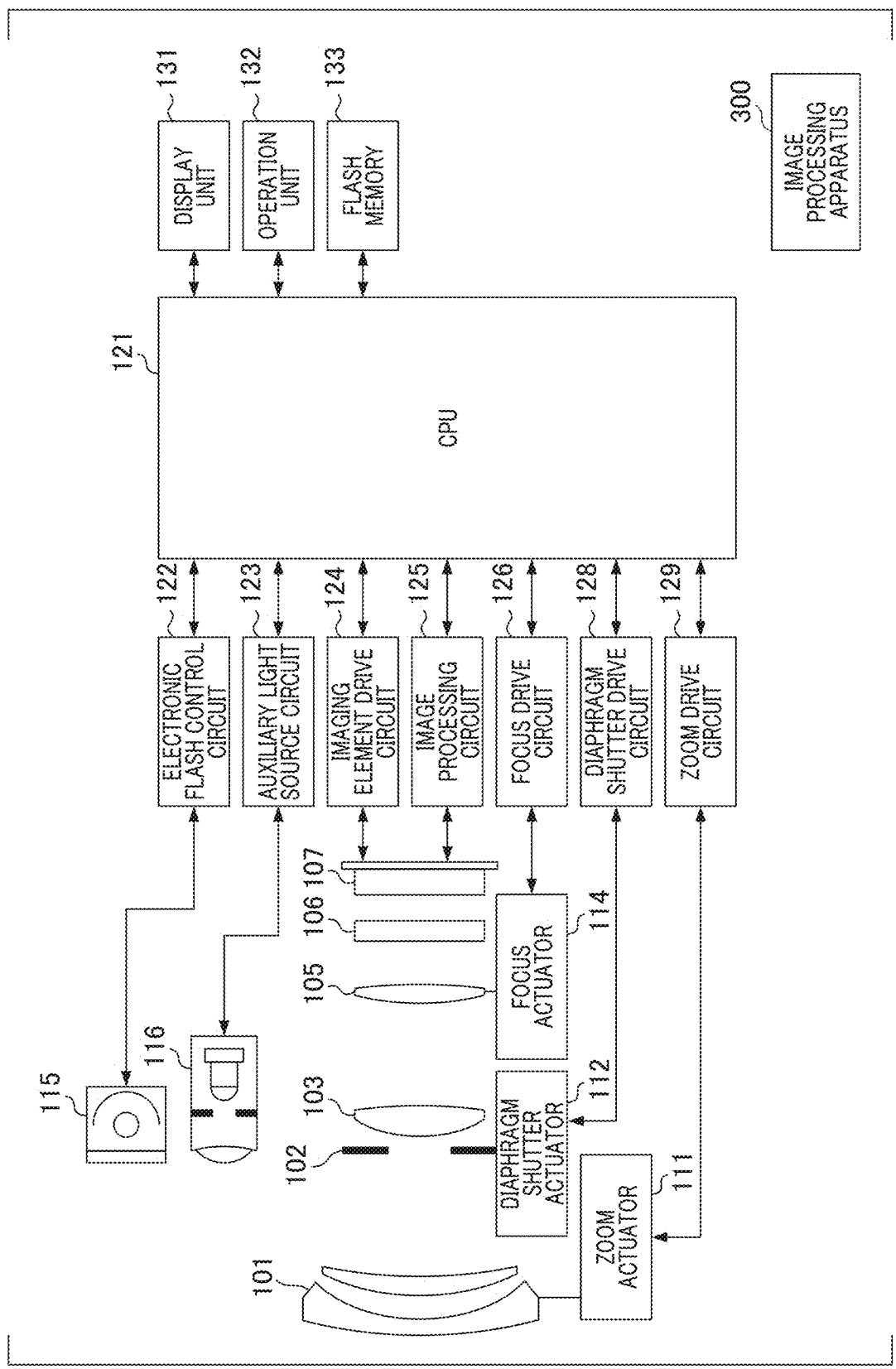
FIG. 1 is a block diagram illustrating an example of a configuration of an imaging apparatus.

FIG. 1 is a block diagram illustrating an example of a configuration of an imaging apparatus including an imaging element. An image processing apparatus 300 may be provided in the imaging apparatus and may be provided independently from the imaging apparatus.

Details of the imaging apparatus will be described. A first lens group 101 arranged at a distal end of an imaging optical system (an image-forming optical system) is held by a lens barrel to be able to move forward and rearward in an optical axis direction. A diaphragm shutter 102 has a function of adjusting an amount of light at the time of photographing by adjusting its aperture diameter and being used as an exposure time adjustment shutter at the time of photographing a still image. A second lens group 103 moves forward and rearward in the optical axis direction together with the diaphragm shutter 102. The second lens group 103 has a zooming action (a zooming function) through interlocking with the forward and rearward movement of the first lens group 101. A third lens group 105 is a focus lens configured to perform focus adjustment by moving forward and rearward in the optical axis direction. An optical low-pass filter 106 is an optical element configured to reduce a false color or moiré for a photographed image. An imaging element 107 is constituted of, for example, a two-dimensional complementary metal oxide semiconductor (CMOS) photosensor and a peripheral circuit and is arranged on an imaging plane of the imaging optical system. Each pixel of the imaging element 107 according to the embodiment includes a plurality of sub-pixels (for example, a first sub-pixel and a second sub-pixel) corresponding to a plurality of photoelectric conversion units, and details of the configuration will be described below with reference to FIGS. 3 to 5.

A zoom actuator 111 performs a zooming operation by rotating a cam barrel (not shown) and moving the first lens group 101 and the second lens group 103 in the optical axis direction. A diaphragm shutter actuator 112 adjusts an amount of photographing light by controlling an aperture diameter of the diaphragm shutter 102 and performs exposure time control at the time of photographing a still image. A focus actuator 114 performs a focus adjustment operation by moving the third lens group 105 in the optical axis direction.

A subject lighting electronic flash 115 is used at the time of photographing, and a flashing lighting device using a xenon tube or a lighting device including a light emitting diode (LED) configured to continuously emit light is used as the subject lighting electronic flash 115. An autofocus (AF) auxiliary light source 116 projects an image of a mask with a predetermined aperture pattern onto a subject field via a projection lens. Thus, focus detection capability of a low-luminance subject or a low-contrast subject is improved.

A central processing unit (CPU) 121 constituting a controller of a camera main body has a central control function responsible for various controls. The CPU 121 includes a calculation unit, a read only memory (ROM), a random access memory (RAM), an analog/digital (A/D) converter, a D/A converter, a communication interface circuit, and the like. The CPU 121 executes a series of operations such as AF control, imaging processing, image processing, and recording processing by driving various circuits in a camera in accordance with a predetermined program stored in the ROM. Furthermore, the CPU 121 may have a function of the image processing apparatus 300 which will be described below.

An electronic flash control circuit 122 controls the lighting of an electronic flash 115 in synchronization with a photographing operation in accordance with a control command of the CPU 121. An auxiliary light source circuit 123 controls the lighting of the AF auxiliary light source 116 in synchronization with a focus detection operation in accordance with a control command of the CPU 121. An imaging element drive circuit 124 controls an imaging operation of the imaging element 107, performs A/D conversion on the acquired imaging signal, and transmits the A/D converted signal to the CPU 121. An image processing circuit 125 performs processing such as gamma conversion, color interpolation, and Joint Photographic Experts Group (JPEG) compression on an image acquired by the imaging element 107 in accordance with a control command of the CPU 121.

A focus drive circuit 126 performs focus adjustment by driving the focus actuator 114 on the basis of the focus detection result in accordance with a control command of the CPU 121 and moving the third lens group 105 in the optical axis direction. A diaphragm shutter drive circuit 128 controls the aperture diameter of the diaphragm shutter 102 by driving the diaphragm shutter actuator 112 in accordance with a control command of the CPU 121. A zoom drive circuit 129 drives the zoom actuator 111 in response to a photographer's zoom operation instruction in accordance with a control command of the CPU 121.

A display unit 131 includes a display device such as a liquid crystal display device (LCD) and displays information on a photographing mode of the camera, a preview image before photographing and a confirmation image after photographing, an in-focus state display image at the time of focus detection, or the like. An operation unit 132 includes a power switch, a release (photographing trigger) switch, a zoom operation switch, a photographing mode selection switch, and the like as operation switches and outputs an operation instruction signal to the CPU 121. A flash memory 133 is a recording medium attached to and detachable from the camera main body and records data for a photographed image or the like.

Figure 2:
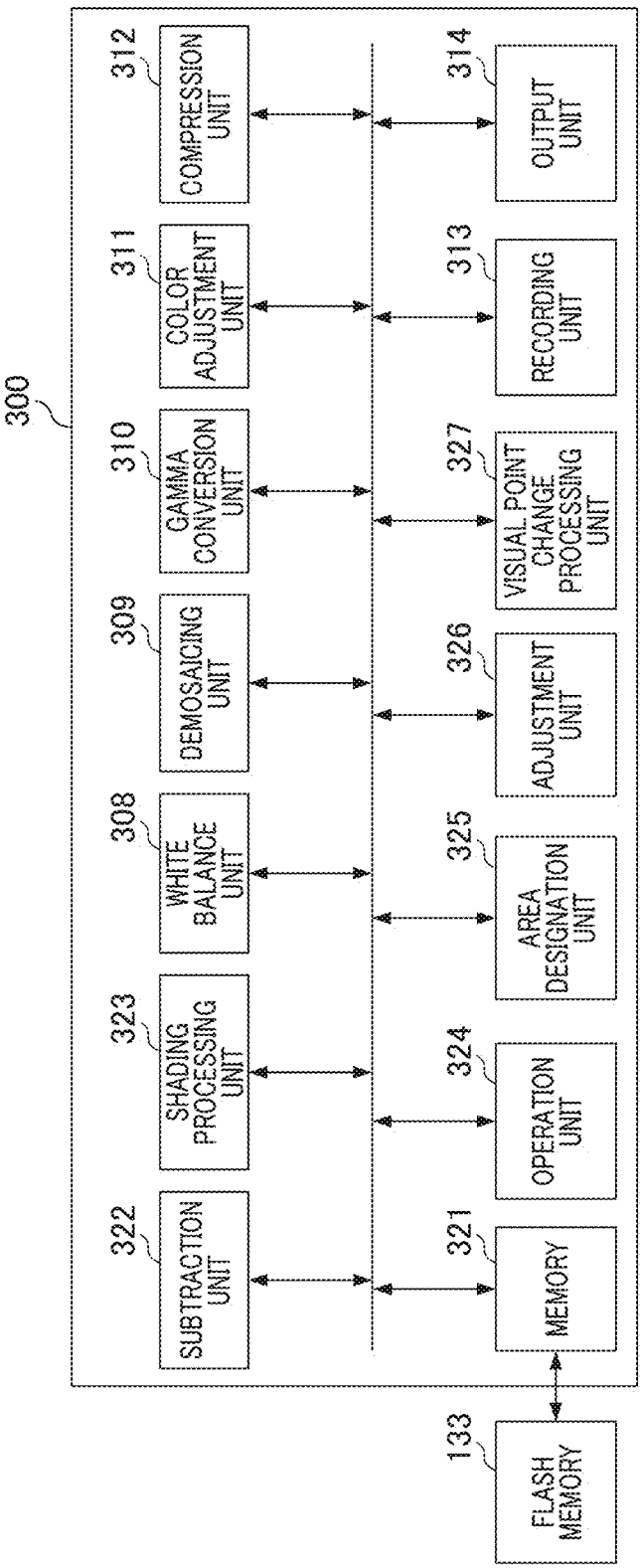
FIG. 2 is a block diagram illustrating an example of a configuration of the image processing apparatus.

A configuration of the image processing apparatus 300 will be described below with reference to FIG. 2. FIG. 2 is a block diagram illustrating an example of a configuration of the image processing apparatus 300.

A memory 321 stores image data. The stored image data is a captured image and a plurality of visual point images which are also used for display on the display unit 131, recording on the flash memory 133, and the like. The captured image is an image (an A+B image) obtained by combining all signals of the first sub-pixel and the second sub-pixel. The visual point image is, for example, a first visual point image (an A image) generated by selecting a signal of a first sub-pixel for each pixel. A subtraction unit 322 generates a second visual point image (a B image) by subtracting a first visual point image (an A image) from a captured image (an A+B image). For example, the memory 321 acquires image data acquired from the imaging element 107 and recorded in the flash memory 133 from the flash memory 133.

A shading processing unit 323 corrects a change in light amount depending on image heights of the first visual point image and the second visual point image. An operation unit 324 generates a user interface through which a user adjusts visual point movement, displays the generated user interface on a display device (not shown) via an output unit 314, and receives adjustment values associated with visual point movement and focus adjustment (refocus) set by the user through the user interface. Moreover, the adjustment values operated by the user are transferred to a visual point change processing unit 327. The visual point change processing unit 327 performs image processing using a plurality of visual point images on the basis of an adjustment value acquired from the operation unit 324. The visual point change processing unit 327 generates an image obtained by changing an addition ratio of a visual point image to change a visual point or an image obtained by changing a depth of field using image processing.

An area designation unit 325 serving as an area designation means for designating a plurality of areas from an image allows the user to designate an arbitrary area in the image using a user interface (UI) in a display screen, stores coordinate information such as a coordinate position of the designated area and vertical and horizontal sizes, and delivers the coordinate information to an adjustment unit 326. The adjustment unit 326 receives information on the designated area from the area designation unit 325 and changes an adjustment range for image processing of a visual point change or the like for each area.

Constituent elements configured to perform a developing process in the image processing apparatus 300 will be described below. A white balance unit 308 performs white balance processing. To be specific, a gain is applied to each color of R, G, and B so that R, G, and B of a white area are isochromatic. By performing white balance processing before a demosaicing process, it is possible to prevent saturation from becoming higher than saturation of a false color due to a color cast or the like at the time of calculating saturation, thereby preventing erroneous determination.

A demosaicing unit 309 interpolates color mosaic image data of the missing two of the three primary colors in each pixel to generate a color image having color image data of R, G, and B in all pixels. To be specific, first, interpolation is performed on a pixel of interest using the surrounding pixels in each defined direction and then direction selection is performed so that color image signals for the three primary colors of R, G, and B are generated as the interpolation processing results for each pixel. A gamma conversion unit 310 performs gamma correction processing on color image data of each pixel to generate basic color image data. A color adjustment unit 311 performs various color adjustment processes such as noise reduction, saturation emphasis, hue correction, and edge emphasis serving as processes for improving the appearance of an image.

A compression unit 312 compresses the color-adjusted color image data using a method such as JPEG and reduces a data size at the time of recording. A recording unit 313 records image data compressed by the compression unit 312 on the recording medium such as a flash memory. The output unit 314 outputs the generated user interface or image to display the UI or image on the display device (not shown). Note that, although the image processing has been described to be processed in the image processing apparatus 300 in the embodiment, a control program for the above-described image processing may be configured to be included in the imaging apparatus separately from the image processing apparatus. In this case, the output unit 314 outputs a user interface or an image to the display unit 131 of the imaging apparatus.

Figure 3:
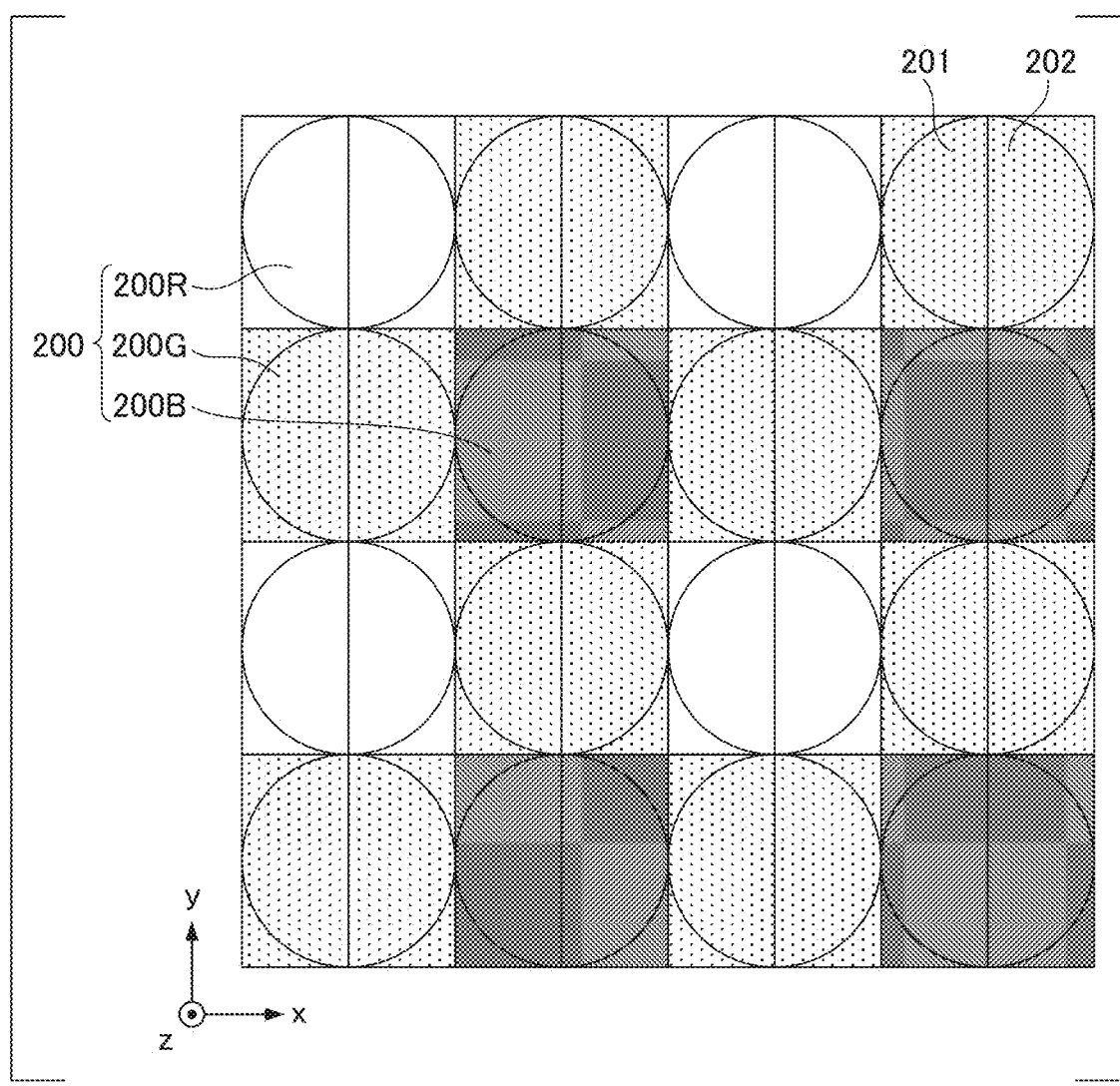
FIG. 3 is a schematic diagram of a pixel array.

FIG. 3 is a diagram showing a schematic diagram of an arrangement of pixels and sub-pixels of the imaging element. A horizontal direction, a vertical direction, and a direction which is orthogonal to an x axis direction and a y axis direction (a direction which is perpendicular to the paper surface) in FIG. 3 are defined as the x axis direction, the y axis direction, and a z axis direction, respectively. In FIG. 3, a pixel array of the two-dimensional CMOS sensor (the imaging element) according to the embodiment is illustrated in a range of four columns and four rows and a sub-pixel array is illustrated in a range of eight columns and four rows.

A pixel 200 with two columns and two rows illustrated in FIG. 3 has an arrangement in which a pixel 200R with spectral sensitivity of R (red) is located on the upper left, pixels 200G with spectral sensitivity of G (green) are located on the upper right and the lower left, and a pixel 200B with spectral sensitivity of B (blue) is located on the lower right. In addition, each of the pixels includes a first sub-pixel 201 and a second sub-pixel 202 divided into two in the x axis direction and formed in one part in the y axis direction. In other words, when the number of divisions in an x direction is expressed as Nx, the number of divisions in a y direction is expressed as Ny, and the number of divisions is expressed as $N_{LF}$, FIG. 3 illustrates an example in which Nx=2, Ny=1, and $N_L = Nx \times Ny = 2$. Each of the sub-pixels has a function as a focus detection pixel configured to output a focus detection signal.

In an example illustrated in FIG. 3, signals used for generating a captured image (an A+B image) and a plurality of visual point images which are also used for displaying on the display unit 131, recording on the flash memory 133, or the like by arranging a plurality of pixels in four columns and four rows (sub-pixels in eight columns and four rows) on a plane can be acquired. In the embodiment, a description will be provided as an imaging element in which a period P of a pixel is 4 μm, the number of pixels N is 5575 columns in a horizontal direction×3725 rows in a vertical direction=approximately 20.75 million pixels, a row direction period PS of a sub-pixel is 2 μm, and the number of sub-pixels NS is 11150 columns in a horizontal direction× 3725 rows in a vertical direction=approximately 41.50 million pixels.

Figure 4A:
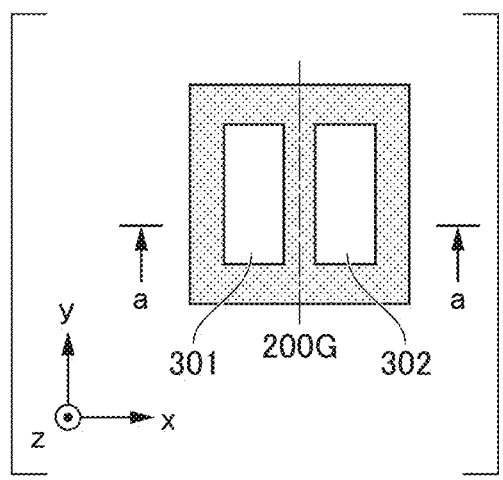
FIGS. 4A and 4B are a schematic plan view and a schematic cross-sectional view of a pixel.
Figure 4B:
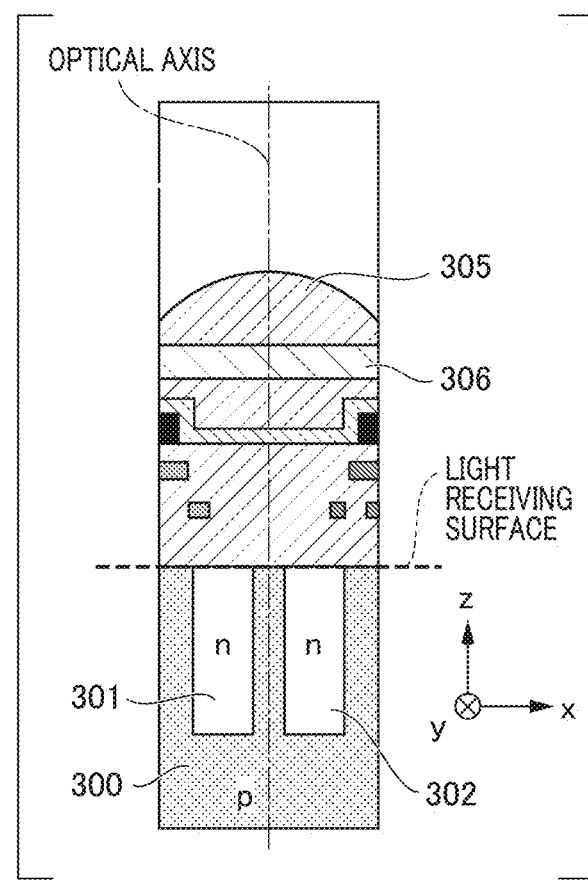

FIG. 4A is a plan view of one pixel 200G of the imaging element shown in FIG. 3 viewed from a light receiving surface side (+z side) of the imaging element. A direction which is perpendicular to the paper surface of FIG. 4A is set as a z axis, and a front side is defined as a positive direction of the z axis. Furthermore, a vertical direction which is orthogonal to the z axis is set as a y axis, an upper side is defined as a positive direction of the y axis, a horizontal direction which is orthogonal to the z axis and the y axis is set as an x axis, and a right side is defined as a positive direction of the x axis. FIG. 4B is a cross-sectional view viewed from a −y side taken along a cutting line a-a.

As shown in FIGS. 4A and 4B, in the pixel 200G, a microlens 305 configured to condense incident light on a light receiving surface side (a +z axis direction) of each of the pixels is formed. In addition, a plurality of photoelectric conversion units with the number of divisions of two divided into two parts in the x direction and one part in the y direction are formed. A first photoelectric conversion unit 301 and a second photoelectric conversion unit 302 correspond to the first sub-pixel 201 and the second sub-pixel 202, respectively. Note that the number of divisions of the photoelectric conversion unit (the sub-pixel) is not limited to two. The direction of division is not limited to the x direction and may be in the y direction.

The first photoelectric conversion unit 301 and the second photoelectric conversion unit 302 are two independent pn junction photodiodes and pin structure photodiodes in which an intrinsic layer is sandwiched between a p-type layer and an n-type layer. Furthermore, the intrinsic layer may be omitted and a pn junction photodiode may be used if necessary. In each pixel, a color filter 306 is formed between the microlens 305 and the first photoelectric conversion unit 301 and the second photoelectric conversion unit 302. Furthermore, the spectral transmittance of the color filter 306 may be changed for each pixel or photoelectric conversion unit (sub-pixel), or the color filter may be omitted if necessary.

Light incident on the pixel 200G is condensed through the microlens 305, spectrally diffracted through the color filter 306, and then received by the first photoelectric conversion unit 301 and the second photoelectric conversion unit 302. In the first photoelectric conversion unit 301 and the second photoelectric conversion unit 302, after electrons and holes are paired in accordance with an amount of received light and separated using a depletion layer, negatively charged electrons are accumulated in the n-type layers (not shown). On the other hand, holes are discharged to the outside of the imaging element through a p-type layer connected to a constant voltage source (not shown). The electrons accumulated in the n-type layers (not shown) of the first photoelectric conversion unit 301 and the second photoelectric conversion unit 302 are transferred to an electrostatic capacitance unit (FD) via a transfer gate and converted into voltage signals.

Figure 5:
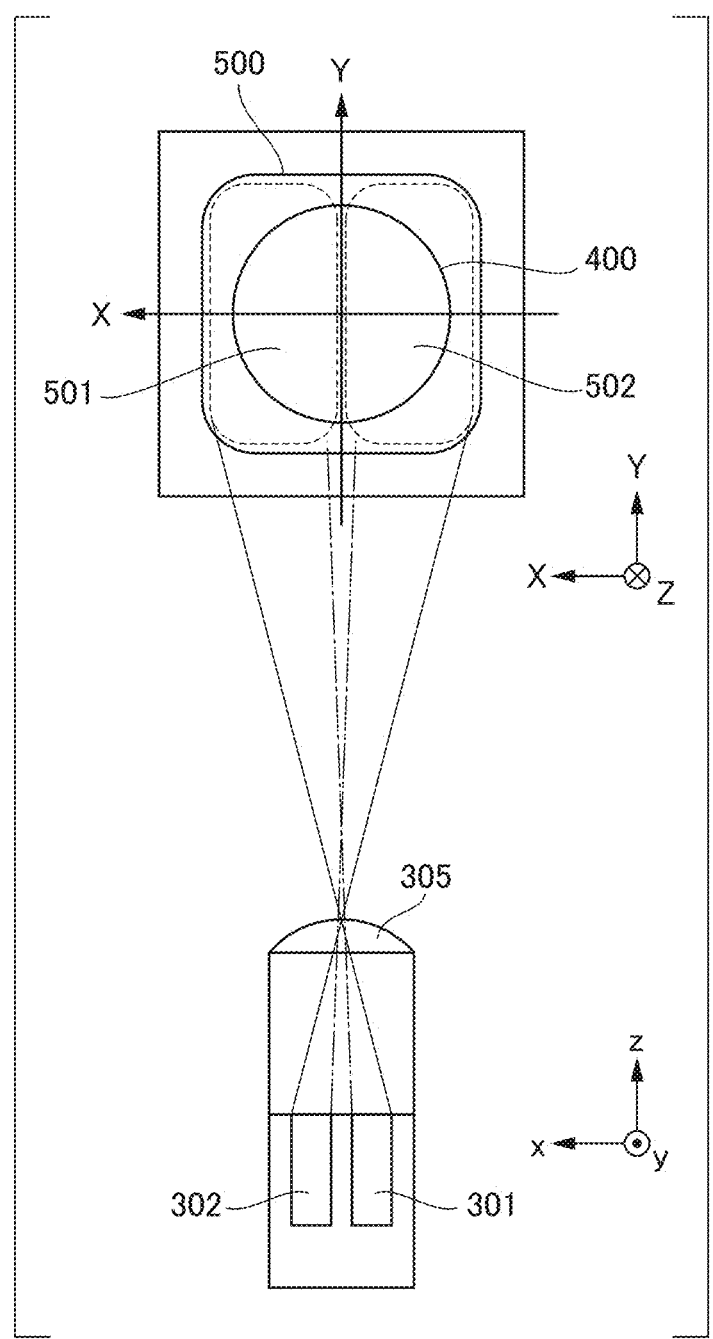
FIG. 5 is a schematic explanatory diagram of a pixel and pupil division.

FIG. 5 is a schematic explanatory diagram for describing a correspondence between a pixel structure and pupil division. FIG. 5 illustrates a cross-sectional view of a cross section taken along the cutting line a-a of the pixel structure shown in FIG. 4A viewed from a +y side and a diagram of an exit pupil plane of the image-forming optical system viewed from a −z axis direction. In FIG. 5, in order to correspond to the coordinate axes of the exit pupil plane, an x axis and a y axis in the cross-sectional view are reversed from the state shown in FIG. 4A. The imaging element is arranged near an imaging plane of a photographing lens (the image-forming optical system), and thus a luminous flux from a subject passes through an exit pupil 400 of the image-forming optical system and is incident on pixels. A surface having the imaging element arranged therein is set as an imaging surface.

A first pupil partial area 501 of the first sub-pixel 201 has substantially an optically conjugate relationship with a light receiving surface of the first photoelectric conversion unit 301, the center of gravity of which is biased in a −x direction by the microlens 305. The first pupil partial area 501 represents a pupil area which can be received by the first sub-pixel 201. The center of gravity of the first pupil partial area 501 of the first sub-pixel 201 is biased to a +x side on a pupil plane.

A second pupil partial area 502 of the second sub-pixel 202 has substantially an optically conjugate relationship with a light receiving surface of the second photoelectric conversion unit 302, the center of gravity of which is biased in the +x direction by the microlens 305. The second pupil partial area 502 represents a pupil area which can be received by the second sub-pixel 202. The center of gravity of the second pupil partial area 502 of the second sub-pixel 202 is biased to a −X side on a pupil plane.

A pupil area 500 has substantially an optically conjugate relationship with a light receiving surface obtained by combining both of the first photoelectric conversion unit 301 and the second photoelectric conversion unit 302 by the microlens 305. The pupil area 500 is a pupil area in which light can be received by the entire pixel 200G obtained by combining both of the first sub-pixel 201 and the second sub-pixel 202.

Figure 6A:
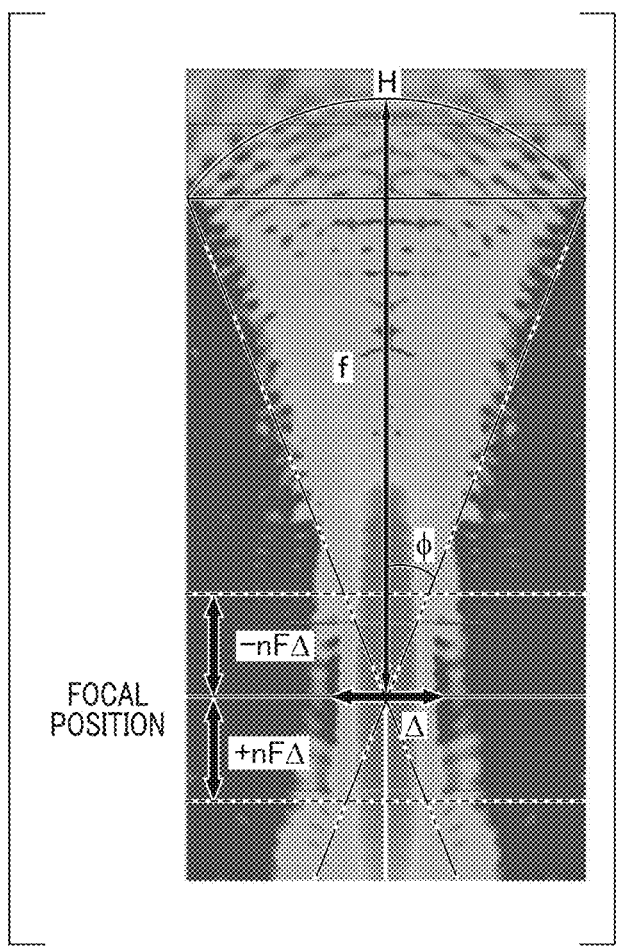
FIGS. 6A and 6B are diagrams illustrating examples of a light intensity distribution inside a pixel.
Figure 6B:
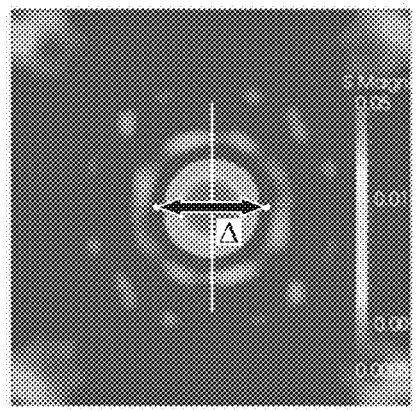

FIGS. 6A and 6B are diagrams illustrating an example of a light intensity distribution when light is incident on a microlens formed in each pixel. FIG. 6A illustrates a light intensity distribution in a cross section which is parallel to an optical axis of the microlens. FIG. 6B illustrates a light intensity distribution in a cross section which is perpendicular to the optical axis of the microlens at a focal position of the microlens. In FIG. 6A, H, f, nFΔ, and φ represent a convex-side surface of the microlens 305, a focal length of the microlens, a movable range of a focal position due to refocusing, and a maximum angle of an incident luminous flux, respectively. Incident light is condensed on a focal position through the microlens. However, a diameter of a condensed spot cannot be made smaller than a diffraction limit Δ, which is a finite size due to the influence of diffraction due to the wave nature of light. A size of the light receiving surface of the photoelectric conversion unit is about 1 to 2 μm, whereas a condensed spot of the microlens is about 1 μm. For this reason, the first pupil partial area 501 and the second pupil partial area 502 in FIG. 5 having a conjugate relationship with the light receiving surface of the photoelectric conversion unit via the microlens are not clearly pupil-divided due to diffraction blur and have a light reception rate distribution (a pupil intensity distribution) depending on an angle of incidence of light.

Figure 7:
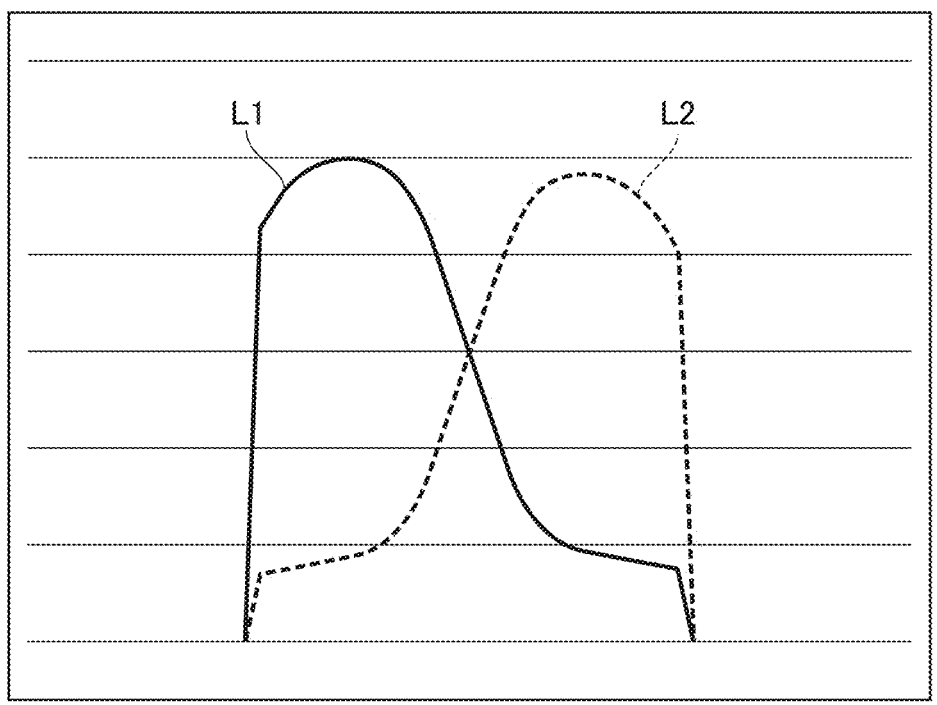
FIG. 7 is a diagram illustrating an example of a pupil intensity distribution.

FIG. 7 is a diagram illustrating an example of a light reception rate distribution (a pupil intensity distribution) depending on an angle of incidence of light. A horizontal axis represents pupil coordinates and a vertical axis represents a light reception rate. A graph line L1 indicated by a solid line in FIG. 7 represents a pupil intensity distribution along the X axis of the first pupil partial area 501 in FIG. 5. A light reception rate indicated by the graph line L1 rises sharply from the left end, reaches the peak, and gradually decreases, and then a rate of change becomes gentle until the right end. Furthermore, a graph line L2 indicated by a broken line in FIG. 7 represents a pupil intensity distribution along the X axis of the second pupil partial area 502. A light reception rate indicated by the graph line L2 rises sharply from the right end, reaches the peak, and gradually decreases, and then a rate of change becomes gentle until the left end to be opposite (bilaterally symmetrical) to the graph line L1. It can be seen in the drawing that pupil division is gently performed.

Figure 8:
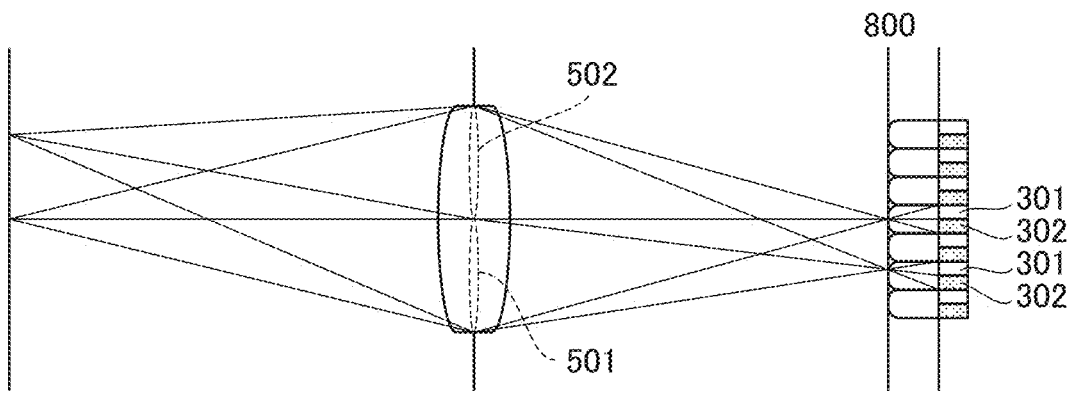
FIG. 8 is a schematic explanatory diagram of an imaging element and pupil division.

FIG. 8 is a schematic diagram illustrating a correspondence between an imaging element and pupil division. The first photoelectric conversion unit 301 and the second photoelectric conversion unit 302 correspond to the first sub-pixel 201 and the second sub-pixel 202, respectively. In each pixel of the imaging element, the first sub-pixel 201 and the second sub-pixel 202 divided into 2×1 parts receive a luminous flux passing through different pupil partial areas of the first pupil partial area 501 and the second pupil partial area 502 of the image-forming optical system. In other words, the luminous flux passing through the different pupil partial areas of the first pupil partial area 501 and the second pupil partial area 502 is incident on each pixel of the imaging element at a different angle and received by the first sub-pixel 201 and the second sub-pixel 202 divided into 2×1 parts.

A visual point image corresponding to a specific pupil partial area in the first pupil partial area 501 and the second pupil partial area 502 of the image-forming optical system can be generated by selecting a signal of a specific sub-pixel from the first sub-pixel 201 and the second sub-pixel 202 for each pixel from a signal received by each sub-pixel. For example, a first visual point image having a resolution of the number of pixels N corresponding to the first pupil partial area 501 of the image-forming optical system can be generated by selecting a signal of the first sub-pixel 201 in each pixel. The same applies to other sub-pixels. The imaging element according to the embodiment has a structure in which a plurality of pixels including a plurality of photoelectric conversion units (sub-pixels) configured to receive a luminous flux passing through different pupil partial areas of the image-forming optical system and can generate a plurality of visual point images for different pupil partial areas.

In the embodiment, the first visual point image and the second visual point image are Bayer array images. A demosaicing process may be performed on the first visual point image and the second visual point image if necessary. Furthermore, a captured image having a resolution of the effective number of pixels N can be generated by adding signals of the first sub-pixel 201 and the second sub-pixel 202 and reading the signals for each pixel of the imaging element.

Figure 9:
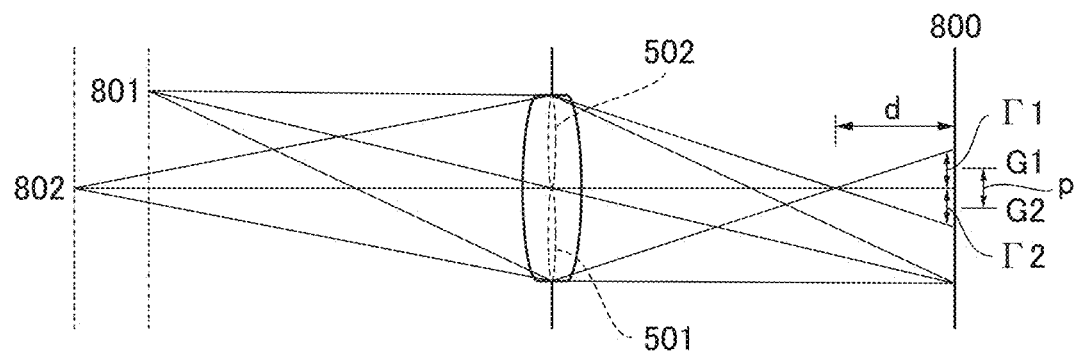
FIG. 9 is a schematic diagram of a relationship between an amount of defocus and an amount of image shift of a first visual point image and a second visual point image.

A relationship between an amount of defocus and an amount of image shift of the first visual point image and the second visual point image acquired by the imaging element according to the embodiment will be described below. FIG. 9 is a diagram showing a schematic relationship of an amount of defocus of the first visual point image and the second visual point image and an amount of image shift between the first visual point image and the second visual point image. The imaging element (not shown) is arranged in an imaging surface 800, and the exit pupil of the image-forming optical system is divided into 2×1 parts, i.e., the first pupil partial area 501 and the second pupil partial area 502 like in the case of FIGS. 5 and 8.

An amount of defocus d represents a distance in which a magnitude |d| is a magnitude from an imaged position of a subject image to the imaging surface 800. Directions are defined such that a front focus state in which an imaged position of a subject is closer to a subject side than an imaging surface is set to a negative sign (d<0) and a rear focus state in which the imaged position of the subject is closer to a side opposite to the subject than an imaging surface is set to a positive sign (d>0). In an in-focus state in which the imaged position of the subject is on an imaging surface (an in-focus position), d=0. In FIG. 9, a subject 801 illustrates an example of a position corresponding to a subject in an in-focus state (d=0), and a subject 802 illustrates an example of a position corresponding to a subject in a front focus state (d<0). In the following description, the front focus state (d<0) and the rear focus state (d>0) are collectively referred to as a defocused state (|d|>0).

In the front focus state (d<0), a luminous flux passing through the first pupil partial area 501 (or the second pupil partial area 502) of a luminous flux from the subject 802 is temporarily condensed and then spreads to have a width Γ1 (Γ2) about a gravity center position G1 (G2) of the luminous flux. In this case, a blurred image is formed on the imaging surface 800. The blurred image is received by the first sub-pixel 201 (or the second sub-pixel 202) constituting each pixel arranged in the imaging element, and the first visual point image (or the second visual point image) is generated. Thus, in the first visual point image (or the second visual point image), the subject 802 is recorded as image data of a subject image (a blurred image) with the blur width Γ1 (Γ2) at the gravity center position G1 (or G2) on the imaging surface 800.

The blur width Γ1 (or Γ2) of the subject image increases substantially proportionally as the magnitude |d| of the amount of defocus d increases. Similarly, a magnitude |p| of an amount of image shift p of a subject image between the first visual point image and the second visual point image (=a difference G1-G2 between gravity center positions of a luminous flux) also increases substantially proportionally as the magnitude |d| of the amount of defocus d increases. Note that, in the rear focus state (d>0), an image shift direction of a subject image between the first visual point image and the second visual point image is opposite to that of the front focus state, but there is a similar tendency.

Therefore, in the embodiment, a magnitude of an amount of image shift between the first visual point image and the second visual point image increases as a magnitude of an amount of defocus of an imaging signal obtained by adding the first visual point image and the second visual point image or the first visual point image and the second visual point image increases.

Figure 10A:
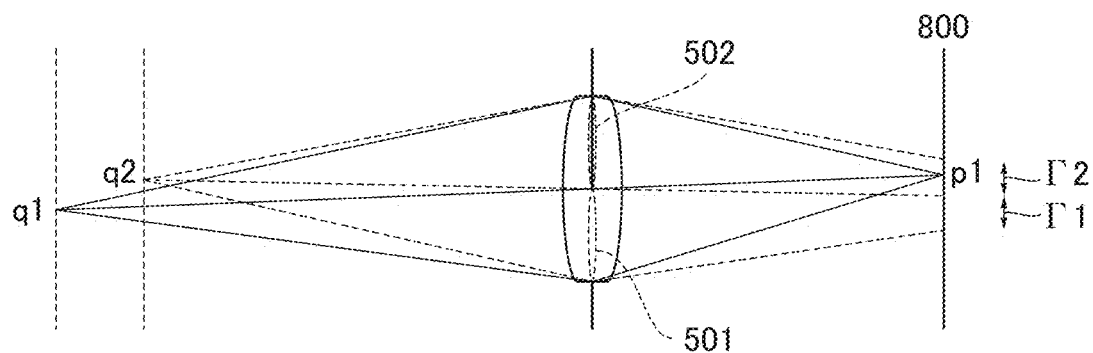
FIGS. 10A to 10C are schematic explanatory diagrams of visual point movement.
Figure 10B:
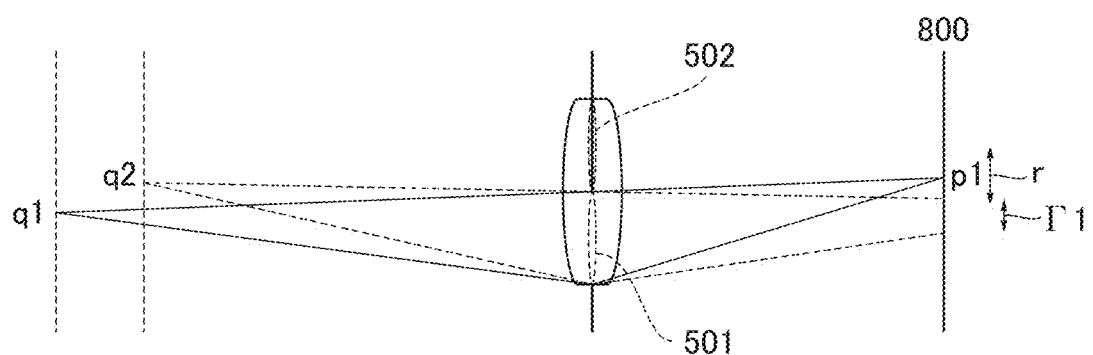
Figure 10C:
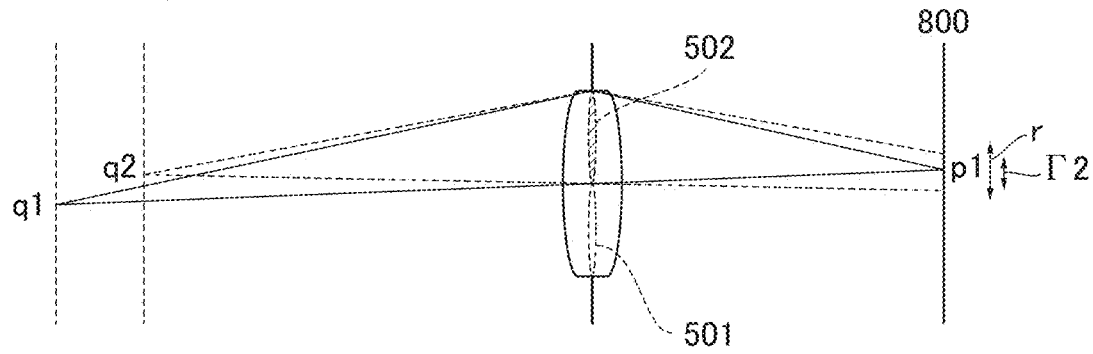

A principle of image processing of visual point movement will be described below with reference to FIGS. 10A to 10C. FIGS. 10A to 10C are schematic explanatory diagrams of the visual point movement. In FIGS. 10A to 10C, the imaging element (not shown) according to the embodiment is arranged in the imaging surface 800, and the exit pupil of the image-forming optical system is divided into two parts, i.e., the first pupil partial area 501 and the second pupil partial area 502 like in the case of FIGS. 5, 8, and 9. The visual point movement is performed using a plurality of parallax images acquired by an imaging element including a plurality of photoelectric conversion units. In the embodiment, a combination image is generated by performing the visual point movement using the first visual point image and the second visual point image.

FIG. 10A illustrates an example in which photographing is performed such that an in-focus image p1 of a main subject q1 and a blurred image Γ1+Γ2 of a subject q2 in front overlap, and a perspective conflict (front blur covering with respect to a main subject) occurs in the photographed image. FIGS. 10B and 10C illustrate such an example using a case in which a luminous flux is divided into a luminous flux passing through the first pupil partial area 501 of the image-forming optical system and a luminous flux passing through the second pupil partial area 502 thereof as an example.

In FIG. 10B, a luminous flux from the main subject q1 passes through the first pupil partial area 501 and forms an image as an image p1 in an in-focus state. On the other hand, a luminous flux from the subject q2 in front passes through the first pupil partial area 501, spreads to a blurred image Γ1 in a defocused state, and is received by the first sub-pixel 201 of each pixel of the imaging element. Moreover, a first visual point image is generated from a light reception signal of the first sub-pixel 201. In the first visual point image, the image p1 of the main subject q1 and the blurred image Γ1 of the subject q2 in front are photographed at different positions without overlapping.

On the other hand, in FIG. 10C, a luminous flux from the main subject q1 passes through the second pupil partial area 502 and forms an image as an image p1 in an in-focus state. On the other hand, a luminous flux from the subject q2 in front passes through the second pupil partial area 502, spreads to a blurred image Γ2 in a defocused state, and is received by the second sub-pixel 202 of each pixel of the imaging element. Moreover, a second visual point image is generated from a light reception signal of the second sub-pixel 202. In the second visual point image, the image p1 of the main subject q1 and the blurred image Γ2 of the subject q2 in front are photographed to overlap.

In FIGS. 10B and 10C, an area near the image p1 of the main subject q1 is set as a predetermined area r. When the first visual point image generated in FIG. 10B and the second visual point image generated in FIG. 10C are compared, in the predetermined area r, the blurred image Γ1 of the subject q2 in front of the first visual point image is narrower in range of the blurred image than the blurred image Γ2 of the subject q2 in front of the second visual point image. Furthermore, since the blurred image Γ1 appears less and the blurred image Γ1 never overlaps the image p1 of the main subject q1 in the predetermined area r of the first visual point image, a contrast evaluation value of the predetermined area r increases. On the other hand, since photographing is performed such that a large area of the blurred image Γ2 appears and the image p1 of the main subject q1 and the blurred image Γ2 overlap in the predetermined area r of the second visual point image, a contrast evaluation value of the predetermined area r decreases.

In the embodiment, in the predetermined area r of the combination image, a weighting factor of a visual point image in which a subject on the closest side is photographed in the widest range among a plurality of visual point images is the smallest or a weighting factor of a visual point image in which a subject on the closest side is photographed in the narrowest range among the plurality of visual point images is the largest. In other words, in the embodiment, in the predetermined area r of the combination image, a weighting factor of a visual point image in which a contrast evaluation value is the smallest among a plurality of visual point images is the smallest or a weighting factor of a visual point image in which a contrast evaluation value is the largest among a plurality of visual point images is the largest.

Therefore, in the embodiment, in the predetermined area r, a combination image is generated such that a first weighting factor Wa of a first visual point image in which the image p1 and the blurred image Γ1 overlap less is larger than a second weighting factor Wb of a second visual point image in which large areas between the image p1 and the blurred image Γ2 overlap. A combination image having the reduced front blur covering with respect to a main subject in a predetermined area can be generated by performing such visual point movement.

Here, a pupil shift at a peripheral image height of the imaging element will be described. FIGS. 11A to 11C are schematic explanatory diagrams of the pupil shift at the peripheral image height of the imaging element. To be specific, relationships among the first pupil partial area 501 in which light is received by the first photoelectric conversion unit 301 of each pixel arranged at the peripheral image height of the imaging element, the second pupil partial area 502 in which light is received by the second photoelectric conversion unit 302 thereof, and the exit pupil 400 of the image-forming optical system are illustrated. The first photoelectric conversion unit 301 and the second photoelectric conversion unit 302 correspond to the first sub-pixel 201 and the second sub-pixel 202.

FIG. 11A illustrates a case in which an exit pupil distance D1 of the image-forming optical system substantially coincides with a set pupil distance Ds of the imaging element. In this case, like in a central image height, even at the peripheral image height of the imaging element, the exit pupil 400 of the image-forming optical system is substantially equally pupil-divided by the first pupil partial area 501 and the second pupil partial area 502.

On the other hand, FIG. 1 illustrates a case in which the exit pupil distance D1 of the image-forming optical system is shorter than the set pupil distance Ds of the imaging element. In this case, a pupil shift occurs between the exit pupil of the image-forming optical system and an entrance pupil of the imaging element at the peripheral image height of the imaging element, and thus the exit pupil 400 of the image-forming optical system is unequally pupil-divided by the first pupil partial area 501 and the second pupil partial area 502. In an example of FIG. 11B, an effective aperture value of the first visual point image corresponding to the first pupil partial area 501 is smaller (brighter) than an effective aperture value of the second visual point image corresponding to the second pupil partial area 502. Conversely, an effective aperture value of the first visual point image corresponding to the first pupil partial area 501 is larger (darker) than an effective aperture value of the second visual point image corresponding to the second pupil partial area 502 at an image height on the opposite side.

FIG. 11C illustrates a case in which the exit pupil distance D1 of the image-forming optical system is longer than the set pupil distance Ds of the imaging element. Also, in this case, at the peripheral image height of the imaging element, a pupil shift occurs between the exit pupil of the image-forming optical system and the entrance pupil of the imaging element at the peripheral image height of the imaging element, and thus the exit pupil 400 of the image-forming optical system is unequally pupil-divided by the first pupil partial area 501 and the second pupil partial area 502. In an example of FIG. 11C, an effective aperture value of the first visual point image corresponding to the first pupil partial area 501 is larger (darker) than an effective aperture value of the second visual point image corresponding to the second pupil partial area 502. Conversely, an effective aperture value of the first visual point image corresponding to the first pupil partial area 501 is smaller (brighter) than an effective aperture value of the second visual point image corresponding to the second pupil partial area 502 at an image height on the opposite side.

Effective F numbers of the first visual point image and the second visual point image become non-uniform as pupil division becomes uneven at the peripheral image height due to the pupil shift, and thus the spread of blur is large in one of the first visual point image and the second visual point image and the spread of blur is small in the other visual point image. For this reason, it is desirable that a weighting factor of a visual point image in which an effective aperture value is the smallest among a plurality of visual point images be the smallest or a weighting factor of a visual point image in which an effective aperture value is the largest among a plurality of visual point images be the largest in the predetermined area of the combination image. With the above configuration, front blur covering with respect to a main subject can be reduced by performing image processing for visual point movement on an image after photographing.

A depth change process will be described below. In FIG. 11B, an image obtained by light passing through the first pupil partial area 501 is a first visual point image, and an image obtained by light passing through the second pupil partial area 502 is a second visual point image. Since each visual point image is an image obtained by light passing through a half of the original pupil area and an aperture diameter in a horizontal direction is halved in the case of a pupil partial area divided into two parts in the horizontal direction, a depth of field in the horizontal direction is quadrupled. Note that, since a pupil area is not configured to be pupil-divided in a vertical direction in the example of the embodiment, a depth of field does not change in the vertical direction. For this reason, the first visual point image or the second visual point image is an image with a depth of field which is twice a depth of field of an image (an A+B image) obtained by combining the first and second visual point images in terms of a vertical/horizontal average.

As described above, an image obtained by enlarging a depth of field can be generated by generating a combination image obtained by changing an addition ratio between the first visual point image and the second visual point image to a ratio other than 1:1 using the visual point change processing unit 327. In addition, a combination image on which depth enlargement and edge enhancement have been performed can be generated by performing unsharp mask processing using a contrast distribution or an image shift distribution on the image obtained by changing the addition ratio between the first visual point image and the second visual point image using the visual point change processing unit 327.

Figure 12A:
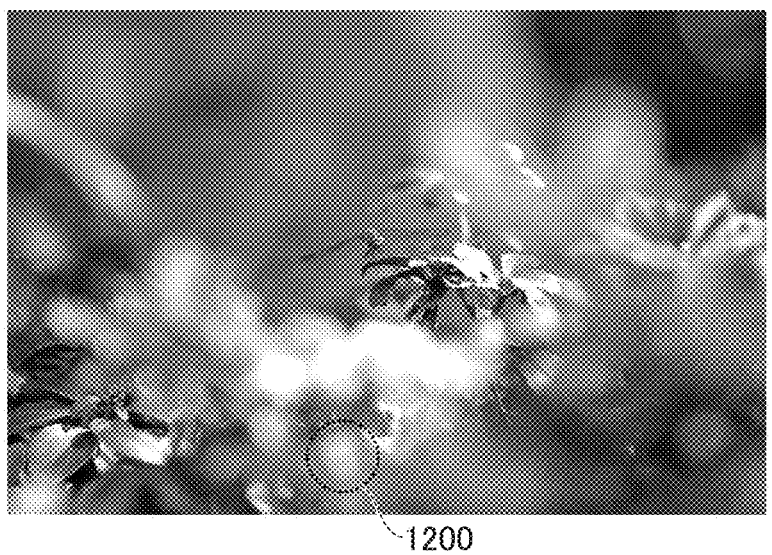
FIGS. 12A to 12C are diagrams illustrating an example of a visual point image.
Figure 12B:
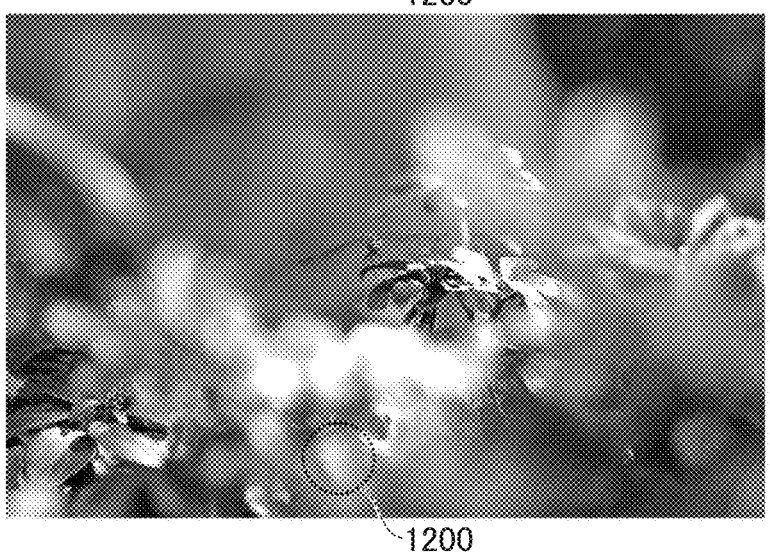
Figure 12C:
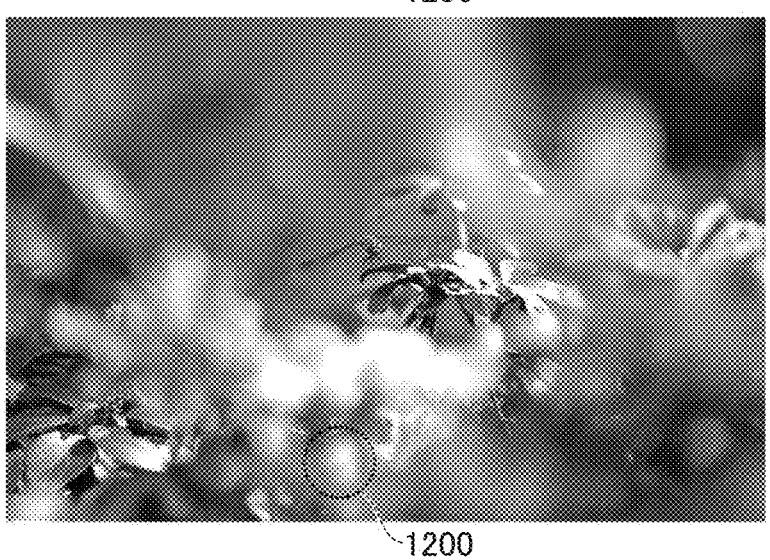
Figure 13A:
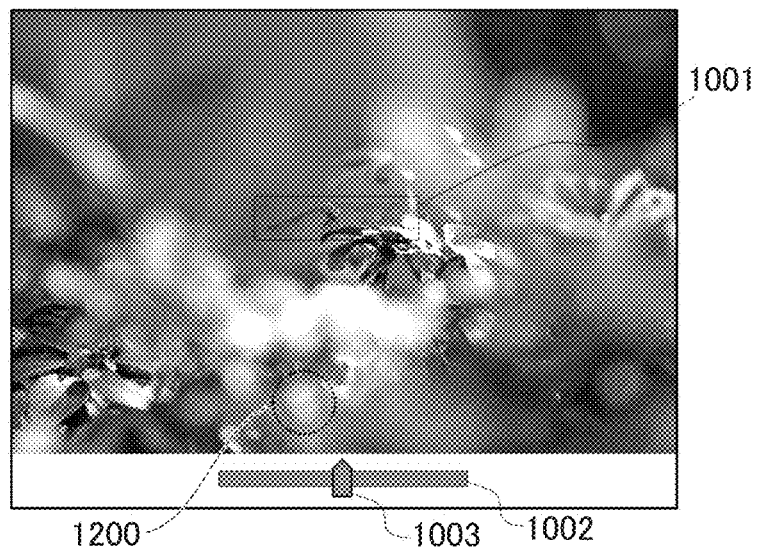
FIGS. 13A to 13C are schematic diagrams of a visual point image and a user interface (UI).
Figure 13B:
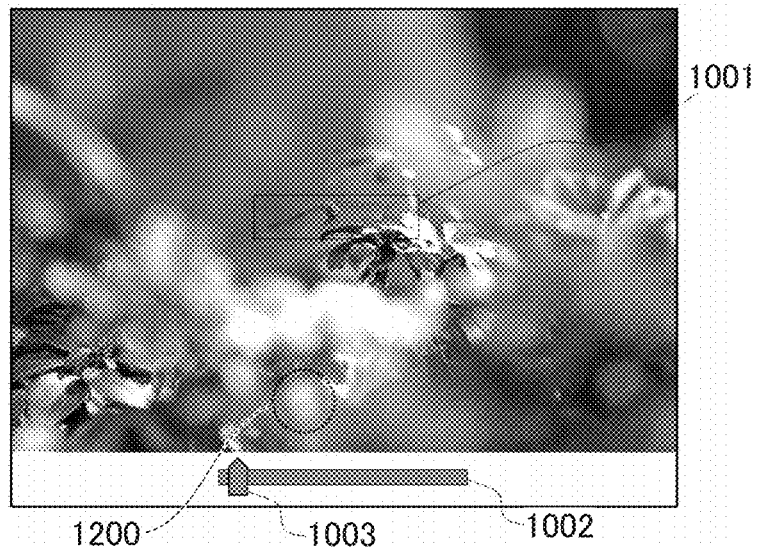
Figure 13C:
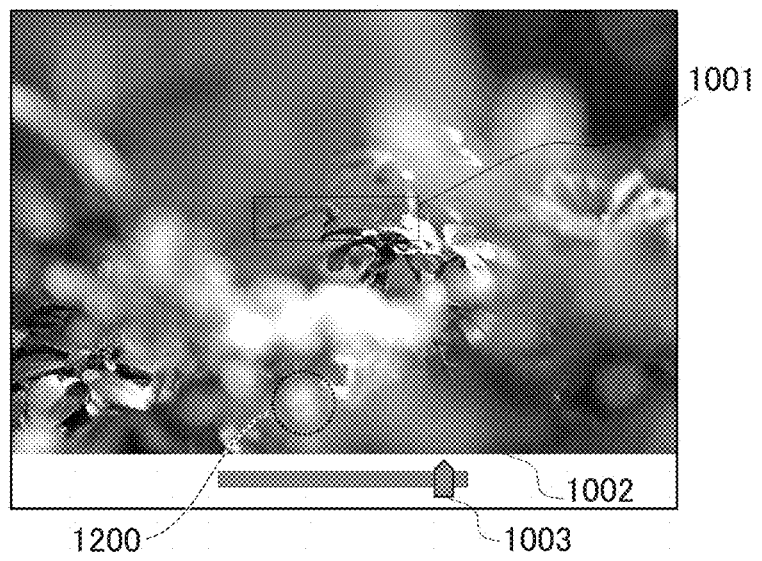

An area designation will be described below with reference to FIGS. 12A to 12C and 13A to 13C. FIGS. 12A to 12C are diagrams illustrating examples of blur shapes in a visual point image and a combination image. FIGS. 13A to 13C are diagrams illustrating an example in which the user designates an area and performs visual point movement or a depth change.

FIG. 12A illustrates an image (an A+B image) obtained by combining the first visual point image and the second visual point image. FIG. 12B illustrates the first visual point image (an A image). FIG. 12C illustrates the second visual point image (a B image). The blur shapes of the A+B image, the A image, and the B image are compared in a region 1200 enclosed within the dotted line in each drawing. The right side of the blur shape of the region 1200 in FIG. 12B illustrating the image (the first visual point image) of the A image is omitted as compared with FIG. 12A illustrating the image (the combination image) of the A+B image. Furthermore, the left side of the blur shape of the region 1200 in FIG. 12C illustrating the image (the second visual point image) of the B image is omitted. Since an effective F number is large and a shape is a semicircular shape due to luminous fluxes passing through the first pupil partial area 501 and the second pupil partial area 502 serving as parts of the pupil area in the first visual point image and the second visual point image, the blur shape turns from a perfect circle into a deformed blur.

Thus, in the embodiment, visual point movement or depth enlargement is performed only in the area designated by the user to minimize an undesired change in blur shape or the like, and the effect of the image processing using the visual point image is prohibited or reduced in other areas. Therefore, the user designates an area in which he or she wants to move a visual point, and image processing may be performed on a designated area and an area other than the designated area using different parameters. Furthermore, in the embodiment, in order not to change the blur shape of the image-forming optical system in an area on which a visual point movement process is not performed, that is, an area other than a designated area, a weighting factor (a first weighting factor or a second weighting factor) for each of a plurality of visual point images is substantially equally added to generate a combination image.

FIGS. 13A to 13C illustrate an example in which visual point movement is performed by designating an area.

First, an A+B image is displayed as shown in FIG. 13A. Moreover, the user is caused to designate a designated area 1001 on which visual point movement or depth enlargement is performed in an image. The imaging element according to the embodiment has a visual point image in the horizontal direction because the imaging element has a configuration in which the imaging element is pupil-divided into two parts in the horizontal direction. For this reason, a slider bar 1002 and a slider 1003 are arranged in the horizontal direction as a UI for allowing the user to perform an operation in a direction in which the visual point changes. When a value of the right end of the slider is defined as 1, a value of the center thereof is defined as 0, and a value of the left end thereof is defined as −1, an addition ratio is changed so that a ratio between the first visual point image and the second visual point image is (1+x):(1−x) when the slider is at an arbitrary position x, and a combination image whose visual point has moved is generated.

FIG. 13A illustrates an image when a slider position is the center, and a combination ratio of the first visual point image and the second visual point image in this case is 1:1. FIG. 13B illustrates an image when a slider position is the left end, and a combination ratio of the first visual point image and the second visual point image in this case is 0:2. FIG. 13C illustrates an image when a slider position is the right end, and a combination ratio of the first visual point image and the second visual point image in this case is 2:0. Therefore, the designated area 1001 in FIG. 13B is generated only with the second visual point image and the designated area 1001 in FIG. 13C is generated only with the first visual point image. On the other hand, in order to change an addition ratio of a visual point image only in the designated area 1001, a combination ratio of each visual point image in an area other than the designated area 1001 (for example, the region 1200 surrounded by a dotted line) remains 1:1, that is, the original A+B image remains. For this reason, the blur shape of the region 1200 does not become a deformed blur from a perfect circle.

Although an example in which the addition ratio of the visual point image of the area other than the designated area 1001 is not changed has been described in the embodiment, an area other than the designated area 1001 may be set as a different adjustment range from the designated area 1001. For example, an addition ratio between visual point images may be set from the maximum (0:10) to the minimum (10:0) in the designated area 1001, set from the maximum (3:7) to the minimum (7:3) in an area other than the designated area 1001, and restricted to an adjustment range in which deformation of a blur shape from a perfect circle to a deformed blur can be reduced.

As described above, when a combination is performed by changing weights of a plurality of visual point images corresponding to divided pupil areas, deformation of a blur shape from a perfect circle can be reduced and visual point movement or depth enlargement can be performed only on a desired subject (area).

Image processing of visual point movement according to the embodiment will be described below. Front blur covering on a main subject can be reduced, for example, by adjusting blur using visual point movement.

First, the image processing apparatus 300 acquires a captured image acquired by the imaging element 107 and a first visual point image, inputs the captured image and the first visual point image to the subtraction unit 322, and generates a second visual point image. Moreover, the first visual point image and the second visual point image are input to the visual point change processing unit 327. The visual point change processing unit 327 generates a combination image from the plurality of acquired visual point images (the first visual point image and the second visual point image). Such a combination image is an image whose visual point can be moved by changing a combination ratio (weight) of each visual point image. Note that an image captured by the subtraction unit 322 may be an image captured by the imaging element according to the embodiment and stored in the recording medium in advance.

Hereinafter, it is assumed that j and i are integers, a position of $j^{th}$ in a row direction and $i^{th}$ in a row direction of a first visual point image and a second visual point image is set to (j,i), a first visual point image of a pixel at a position (j,i) is set to A(j,i), and a second visual point image thereof is set to B(j,i).

In a first step, the adjustment unit 326 sets a designated area R=[j1,j2]×[i1,i2] used to perform visual point movement and a boundary width σ of the designated area. The designated area R is an arbitrary area designated by the user using a UI operation on the display screen or the like. The area designation unit 325 acquires coordinate information or the like of the area designated by the user and inputs the acquired coordinate information to the adjustment unit 326. The adjustment unit 326 calculates a table function T(j,i) according to the designated area R and the boundary width σ of the designated area using Expression (1).

(Expression 1)

$$T(j,i) = \\ 0.5 * \left[\tanh\frac{(j-j_1)}{\sigma} - \tanh\frac{(j-j_2)}{\sigma}\right] \times 0.5 * \left[\tanh\frac{(i-i_1)}{\sigma} - \tanh\frac{(i-i_2)}{\sigma}\right]. \quad (1)$$

The table function T(j,i) is 1 inside the designated area R, 0 outside of the designated area R, and continuously changes approximately from 1 to 0 at the boundary width σ of the designated area R. The designated area may be a circular shape or any other arbitrary shapes if necessary. Furthermore, a plurality of designated areas and a boundary width may be set if necessary.

In a second step, the visual point change processing unit 327 calculates a weighting factor of each visual point image in the designated area R used to perform visual point movement. To be specific, a first weighting factor Wa(j,i) of a first visual point image A(j,i) is calculated using a real coefficient w(−1≤w≤1) and Expression (2A). In addition, a second weighting factor Wb(j,i) of a second visual point image B(j,i) is calculated using Expression (2B).

(Expression 2A)

$$W_a(j,i)=1-wT(j,i), \quad (2\,\mathrm{A})$$

(Expression 2B)

$$W_b(j,i)=1+wT(j,i). \quad (2\,\mathrm{B})$$

In a third step, the visual point change processing unit 327 generates a combination image used to perform visual point movement of the designated area R. To be specific, a combination image I(j,i) is generated from the first visual point image A(j,i), the second visual point image B(j,i), a first weighting factor Wa(j,i), and a second weighting factor Wb(j,i) using Expression (3).

(Expression 3)

$$I(j,i)=W_a(j,i)*A(j,i)+W_b(j,i)*B(j,i). \quad (3)$$

The visual point change processing unit 327 may generate a combination image Is(j,i) using Expression (4A) or Expression (4B) in combination with a refocusing process as an amount of shift s if necessary.

(Expression 4A)

$$I_s(j,i)=W_a(j,i)*A(j,i)+W_b(j,i)*B(j,i+s), \quad (4\,\mathrm{A})$$

(Expression 4B)

$$I_s(j,i)=W_a(j,i)*A(j,i)+W_b(j,i+s)*B(j,i+s). \quad (4\,\mathrm{B})$$

In the embodiment, a plurality of visual point images are generated from a signal acquired by the imaging element in which a plurality of pixels including a plurality of sub-pixels configured to receive a luminous flux passing through different pupil partial areas of the image-forming optical system are arranged. Moreover, a combination image is generated by multiplying each of a plurality of visual point images and a weighting factor and performing combination. The weighting factor for each of the plurality of visual point images continuously changes in accordance with an area of the combination image. In the embodiment, a combination image is generated by multiplying each of the plurality of visual point images and the weighting factor and performing addition or shift-addition.

Figure 15:
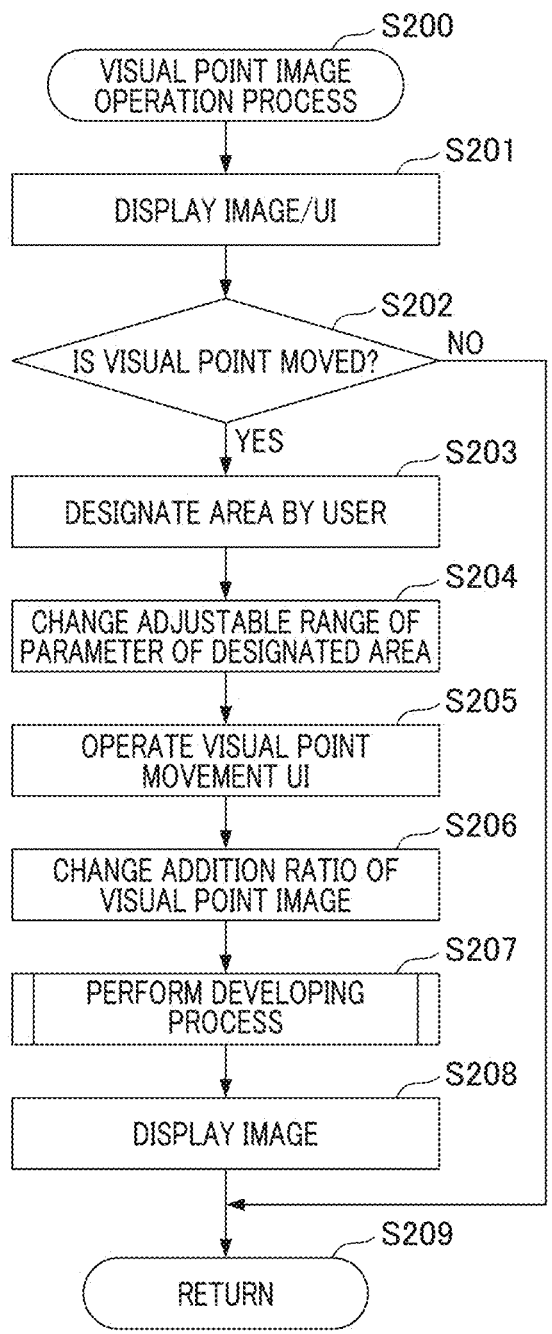
FIG. 15 is a sub-flowchart of a visual point change process.
Figure 16:
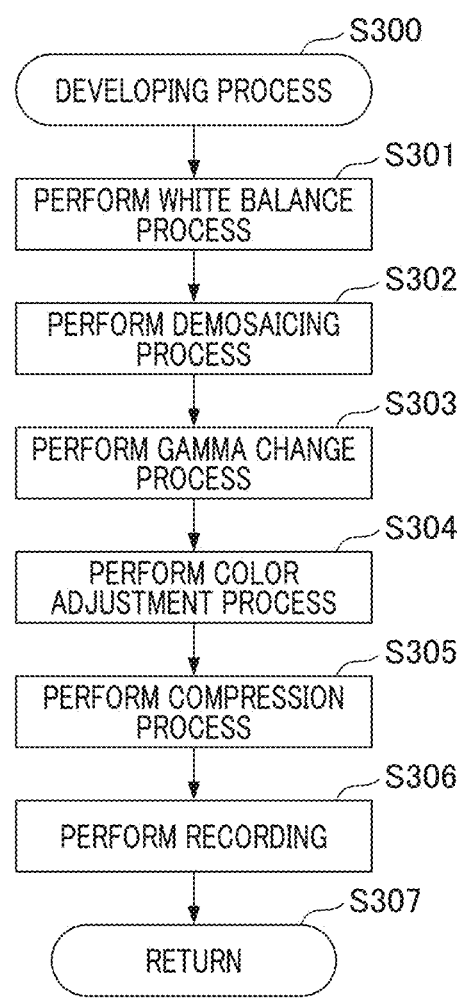
FIG. 16 is a sub-flowchart of a developing process.

Finally, a flow of a process of generating a combination image using a plurality of visual point images will be described with reference to FIGS. 14 to 16.

Figure 14:
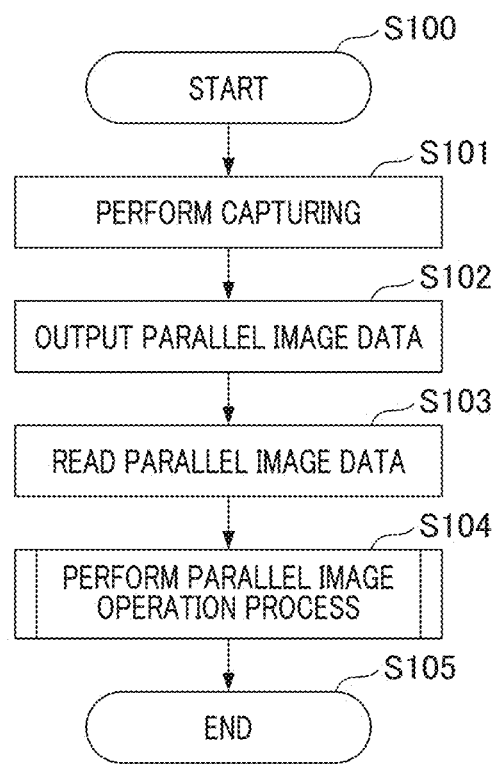
FIG. 14 is a main flowchart.

FIG. 14 is a main flowchart for describing a process of generating a combination image. In S100, the process starts and proceeds to a process of S101. In S101, the imaging element 107 captures a visual point image (an A+B image and an A image). Moreover, in S102, the visual point image (the A+B image and the A image) is output from the imaging element 107 and stored in the flash memory 133 as image data of one file format. In S103, the image data stored in the flash memory 133 in S102 is read to the memory 321 of the image processing apparatus 300. At this time, the subtraction unit 322 generates the second visual point image (the B image) from the captured image (the A+B image) and the first visual point image (the A image) read to the memory 321, and the memory 321 also reads the second visual point image generated by the remaining original part. In S104, the image processing apparatus 300 performs image processing (a visual point image operation process), and the process proceeds to a process of S105 and then ends. The image processing (the visual point image operation process) in S104 will be described with reference to a sub-flowchart of FIG. 15.

Image processing using an area designation (a visual point image operation process) will be described below with reference to the sub-flowchart of FIG. 15. Here, as an example of the image processing, a case in which the visual point movement process is performed will be described.

In S200, the visual point image operation process starts and the process proceeds to a process of S201. In S201, the operation unit 324 displays an image and a UI on the display device via the output unit 314. The image displayed at this time is an image corresponding to image data based on a plurality of visual point images, and an image in which an addition ratio of each visual point image is 1:1, that is, a captured image (an A+B image), is first displayed. In S202, the operation unit 324 determines whether visual point movement is performed on the basis of the user's selection in the UI and the process proceeds to a process of S203 when it is determined that the visual point movement is performed. On the other hand, the process proceeds to a process of S209 and then ends when it is determined that the visual point movement is not performed.

In S203, the user designates an area on which the visual point movement is performed in the image displayed on the display device, and the area designation unit 325 acquires coordinate information such as coordinates or sizes of the designated area. In S204, the adjustment unit 326 sets an adjustable range for parameters of each area designated in S203. Note that, although the parameters according to the embodiment include an addition ratio of each visual point image, other image processing for sharpness or the like may be used as a parameter. In S205, the user operates a visual point movement UI and thus the operation unit 324 acquires an adjustment value in accordance with a slider position set by the user. The visual point movement UI includes, for example, the slider bar 1002 and the slider 1003 illustrated in FIG. 13. The range of the slider bar 1002 is the adjustable range set in S204, and the adjustment value in which the user can set by operating the slider is within the adjustable range. In S206, the visual point change processing unit 327 changes the addition ratio of the visual point image in accordance with the adjustment value acquired in S205. The first visual point image (the A image) serving as the visual point image is an image at a left visual point and the second visual point image (the B image) is an image at a right visual point. Thus, an image which is subjected to visual point movement is generated by generating a combination image obtained by changing an addition ratio between the first visual point image and the second visual point image in accordance with the slider position. When a value of the right end of the slider is defined as 1, a value of the center thereof is defined as 0, and a value of the left end thereof is defined as −1, the addition ratio is changed so that a ratio between the first visual point image and the second visual point image is (1+x):(1−x) when the slider is in an arbitrary position x. Furthermore, at this time, an addition ratio of a boundary area of the designated area may be determined to be in the middle of an addition ratio between the addition ratio of the designated area and an area adjacent to the designated area.

In S207, a combination image is generated by performing a developing process on image data which has been subjected to the image processing, that is, an image obtained by changing the addition ratio of the visual point image in the area designated by the user. Details of the developing process will be described below with reference to a sub-flowchart of FIG. 16. In S208, the output unit 314 outputs the combination image which has been subjected to the developing process in S207 to the display device and displays the combination image on the display device. Moreover, the process proceeds to a process of S209 and then the visual point image operation process ends.

Note that, although an example in which the area other than the designated area is not adjusted and the addition ratio between the first visual point image and the second visual point image is 1:1 has been described in the embodiment, the present invention is not limited thereto. For example, in an area other than the designated area, visual point movement may be performed in an adjustment range which is more restricted than the designated area.

A developing process will be described below with reference to FIG. 16. In S300, the process starts and proceeds to a process of S301. In S301, the white balance unit 308 performs white balance processing. The white balance processing is a process of applying a gain to each color of R, G, and B so that R, G, and B of a white area have isochroism. In S302, the demosaicing unit 309 performs a demosaicing process. The demosaicing process is a process of performing interpolation in each defined direction and then performing direction selection to generate color image signals of three primary colors of R, G, and B as the interpolation processing results for each pixel. In S303, the gamma conversion unit 310 performs gamma processing. In S304, a color adjustment unit 311 performs a color adjustment process. The color adjustment process includes various processes such as noise reduction, saturation emphasis, hue correction, and edge emphasis which are processes of improving the appearance of an image. In S305, the compression unit 312 compresses the color-adjusted color image data using a method such as a JPEG. In S306, the recording unit 313 records the image data compressed through the compression processing on the recording medium. Moreover, in S307, the process is completed and returns to the sub-flowchart of the visual point image operation.

Note that, although an example in which the area is designated and is subjected to the visual point movement has been described in the above description, the image processing (the visual point image operation process) is not limited to only the visual point movement. For example, the focus adjustment (refocusing) may be performed by designating the area and a process of changing the depth of field may be performed. Also in this case, the weighting factors (addition ratios) of a plurality of visual point images are changed only in the designated area and thus the occurrence of unintended change in the area other than the designated area can be suppressed. Furthermore, although an example in which the visual point image operation is performed on the designated area and is not performed on the other areas has been illustrated, an area in which blur is desired to be maintained or the like may be designated as an area on which the visual point image operation is not performed so that the visual point image operation is performed in other areas.

As described above, according to the embodiment, when the combination image is generated by changing the weights of the plurality of visual point images according to the divided pupil areas, the combination image intended by the user can be provided.

Second Embodiment (Overall Configuration of Digital Camera 1700)

Figure 17:
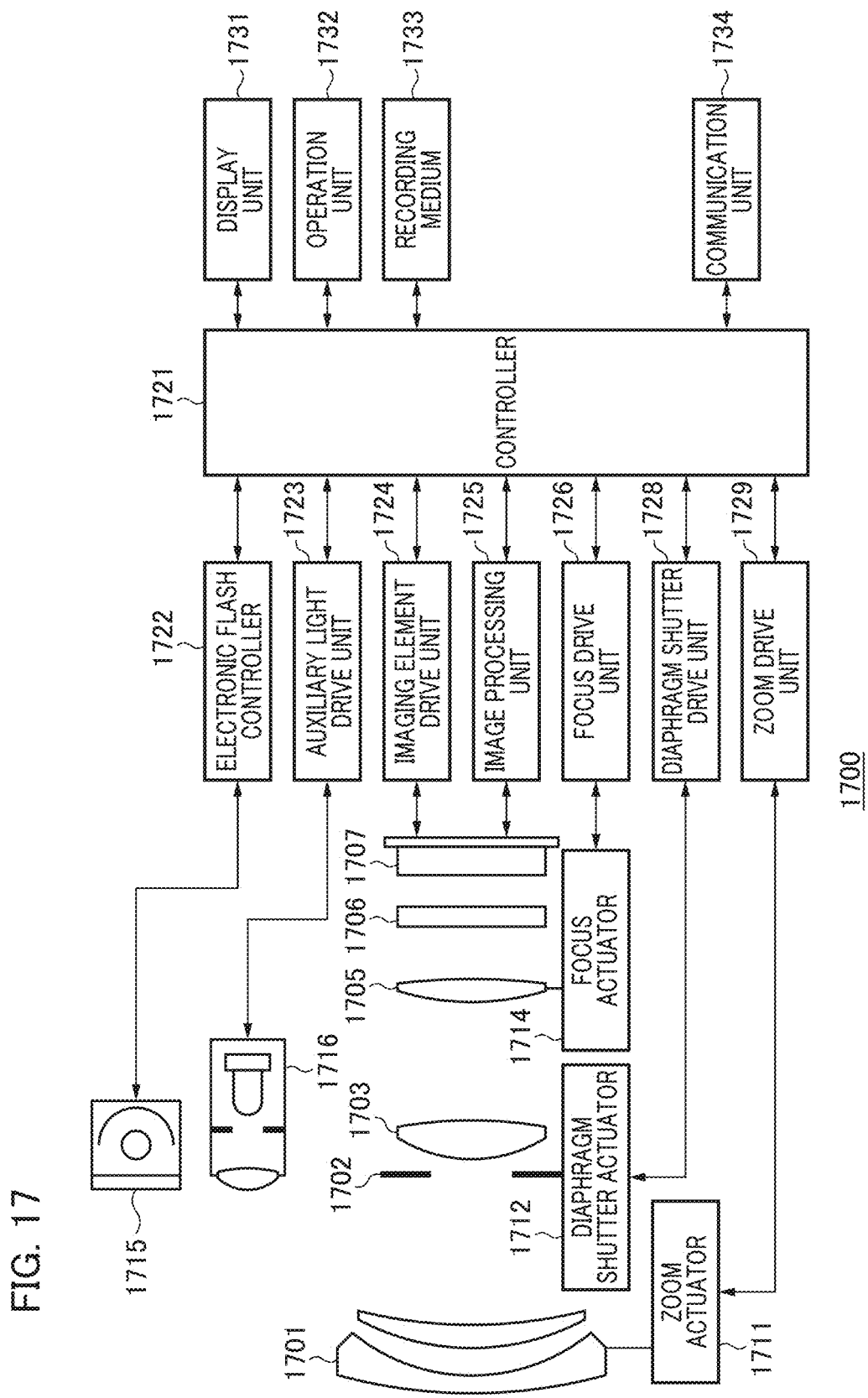
FIG. 17 is a block diagram illustrating an example of a functional configuration of a digital camera.

FIG. 17 is a block diagram illustrating an example of a functional configuration of a digital camera 1700 as an example of the image processing apparatus. Note that one or more of the functional blocks illustrated in FIG. 17 may be realized by hardware such as an application specific integrated circuit (ASIC) or a programmable logic array (PLA) and may be realized when a programmable processor of a CPU, a micro-processing unit (MPU), or the like executes software. Furthermore, such functional blocks may be realized by a combination of software and hardware. Therefore, even when different functional blocks are described as a subject of an operation in the following description, the same hardware can be realized as a subject.

A first lens group 1701 includes, for example, a zoom lens constituting the image-forming optical system, is arranged at a distal end of the image-forming optical system, and is held to move forward and backward in the optical axis direction. A shutter 1702 includes a diaphragm and adjusts an amount of light incident on the imaging element 107 at a time of photographing by adjusting its aperture diameter. Furthermore, the shutter 1702 functions as a shutter configured to adjust an exposure time at a time of photographing a still image. The shutter 1702 and a third lens group 1703 constituting the image-forming optical system move forward and backward together in the optical axis direction perform a zooming action (a zooming function) by interlocking with the forward and rearward movement of the first lens group 1701.

A third lens group 1705 includes, for example, a focus lens constituting the image-forming optical system and performs focus adjustment by moving forward and backward in the optical axis direction. An optical element 1706 includes an optical low-pass filter and reduces a false color or moiré of a captured image. An imaging element 1707 includes an imaging element constituted of, for example, a CMOS photosensor and a peripheral circuit and is arranged in an imaging plane of the image-forming optical system.

A zoom actuator 1711 includes a driving device configured to cause the first lens group 1701 to the third lens group 1703 to move forward and rearward and rotates the cam barrel (not shown) to move the first lens group 1701 to the third lens group 1703 forward and backward in the optical axis direction. A diaphragm shutter actuator 1712 includes a driving device configured to cause the shutter 1702 to operate and controls an aperture diameter or a shutter operation of the shutter 1702 in accordance with control of a diaphragm shutter drive unit 1728. A focus actuator 1714 includes a driving device configured to cause the third lens group 1705 to move forward and backward and performs focus adjustment by moving the third lens group 1705 forward and backward in the optical axis direction.

A lighting device 1715 includes a subject lighting electronic flash at a time of photographing, and is, for example, a flashing lighting device using a xenon tube or a lighting device including a LED configured to continuously emit light. An auxiliary light emitting part 1716 includes a light emitting device for AF auxiliary light, projects an image of a mask having a predetermined aperture pattern onto a subject field via a projection lens, and improve focus detection capability for a dark subject or a low-contrast subject.

A controller 1721 includes a CPU (or an MPU), a ROM, and a RAM, controls each unit of the entire digital camera 1700 by developing and executing the program stored in the ROM, and performs a series of operations such as an AF, photographing, image processing, and recording. Furthermore, the controller 1721 may include an A/D converter, a D/A converter, a communication interface circuit, and the like. In addition, the controller 1721 has a function as a display controller configured to control display contents displayed on a display unit 1731 and may be performed instead of a process performed by an image processing unit 1725.

An electronic flash controller 1722 includes a control circuit or a control module and controls the lighting device 1715 to be turned on in synchronization with a photographing operation. An auxiliary light drive unit 1723 controls the auxiliary light emitting part 1716 to be turned on in synchronization with a focus detection operation. An imaging element drive unit 1724 controls an imaging operation of the imaging element 1707, performs A/D conversion on the acquired image signal, and transmits the converted image signal to the controller 1721. The image processing unit 1725 performs processing such as γ conversion, color interpolation, and JPEG compression on the image acquired by the imaging element 1707.

A focus drive unit 1726, the diaphragm shutter drive unit 1728, and a zoom drive unit 1729 each have a control circuit or a control module. The focus drive unit 1726 controls the focus actuator 1714 on the basis of the focus detection result. Furthermore, the diaphragm shutter drive unit 1728 controls the diaphragm shutter actuator 1712 at a predetermined timing of a photographing operation. In addition, the zoom drive unit 1729 controls the zoom actuator 1711 in accordance with the photographer's zoom operation.

The display unit 1731 includes a display device such as an LCD and displays, for example, information on a photographing mode of the camera, a preview image before photographing and a confirmation image after photographing, an in-focus state display image at a time of focus detection, or the like. An operation unit 1732 includes a group of switches configured to operate the digital camera 1700 and includes, for example, a power switch, a release (photographing trigger) switch, a zoom operation switch, a photographing mode selection switch, and the like. When the operation unit 1732 transmits the input user operation to the controller 1721, the controller 1721 controls each unit of the digital camera 1700 to perform an operation corresponding to the user operation. A recording medium 1733 includes, for example, a removable flash memory and records a photographed image.

A communication unit 1734 includes a communication circuit or a module and establishes communication with an external device (for example, an externally installed server) using a communication method conforming to a predetermined standard. The communication unit 1734 performs, for example, uploading or downloading of image data, receiving the result of predetermined processing performed by an external device on the uploaded image data, and the like with respect to the external device.

(Configuration of Image Processing Unit 1725)

Figure 18:
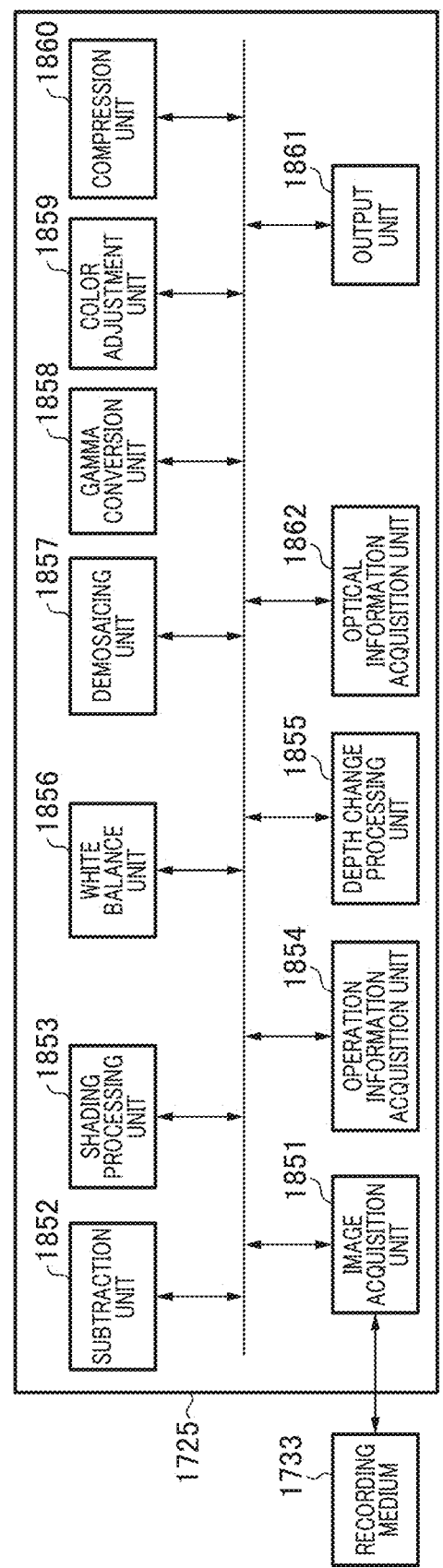
FIG. 18 is a diagram showing a detailed configuration of an image processing unit.

A detailed configuration of the image processing unit 1725 will be described below with reference to FIG. 18. An image acquisition unit 1851 holds the image data read from the recording medium 1733. The image data is image data constituted of an image (also referred to as an A+B image) obtained by combining a first visual point image and a second visual point image which will be described below and a first visual point image.

A subtraction unit 1852 subtracts the first visual point image from the A+B image to generate the second visual point image. A shading processing unit 1853 configured to correct the fall of a peripheral optical amount holds a change in light amount based on image heights of the first visual point image and the second visual point image in the digital camera 1700 in advance as information on the fall of a peripheral optical amount. Alternatively, the shading processing unit 1853 calculates and corrects a light amount ratio between the A+B image and the first visual point image and a light amount ratio between the A+B image and the second visual point image. An operation information acquisition unit 1854 receives the area designated by the user and the adjustment value of the depth change changed by the user and supplies the area and the adjustment value operated by the user to a depth change processing unit 1855.

The depth change processing unit 1855 generates a combination image in which a depth of field is changed by changing an addition ratio (a weight) of the first visual point image and the second visual point image. Although described in detail below, it is possible to generate an image with the depth of field increased by the processing of the depth change processing unit 1855.

Also, the image processing unit 1725 performs a developing process using a configuration of a white balance unit 1856, a demosaicing unit 1857, a gamma conversion unit 1858, and a color adjustment unit 1859 which will be described below. The white balance unit 1856 performs the white balance processing. To be specific, a gain is applied to each color of R, G, and B so that R, G, and B of a white area have isochroism. By performing the white balance processing before the demosaicing process, it is possible to prevent saturation higher than saturation of a false color due to a color cast or the like when the saturation is calculated, thereby preventing erroneous determination.

The demosaicing unit 1857 interpolates two pieces of color mosaic image data out of the missing three primary colors in each pixel, thereby generating a color image in which color image data of R, G, and B are all present in all the pixels. The demosaicing unit 1857 performs interpolation using the pixels around a pixel of interest on the pixel of interest. After that, color image data of the three primary colors of R, G, and B as the results of performing interpolation processing on each pixel is generated.

The gamma conversion unit 1858 applies gamma correction processing to color image data of each pixel to generate, for example, color image data matched with the display characteristics of the display unit 1731. The color adjustment unit 1859 applies, for example, various color adjustment processes such as noise reduction, saturation emphasis, hue correction, and edge emphasis which are processes used to improve the appearance of an image to color image data.

A compression unit 1860 compresses the color-adjusted color image data using a method conforming to a predetermined compression method such as a JPEG and reduces a data size of color image data when recording. An output unit 1861 outputs the color image data, the compressed image data, or the display data for the UI described above.

An optical information acquisition unit 1862 holds an exit pupil distance of the image-forming optical system, a set pupil distance of the imaging element 1707, a photographing aperture value, information on the fall of a peripheral optical amount, and the like which will be described below in advance or acquires by receiving these from the Internet. Furthermore, the optical information acquisition unit 1862 also holds optical information on an image plane movement amount conversion coefficient used to calculate an amount of image plane movement from an amount of image shift of each visual point image in advance or acquires by receiving it from the Internet. The optical information is used by the depth change processing unit 1855.

(Configuration of Imaging Element 1707)

The arrangement and structure of the pixels and sub-pixels of the imaging element 1707 according to the embodiment is similar to those of the imaging element 107 according to the first embodiment.

(Relationship Between Pixel Structure and Pupil Division of Imaging Element 1707)

Figure 19A:
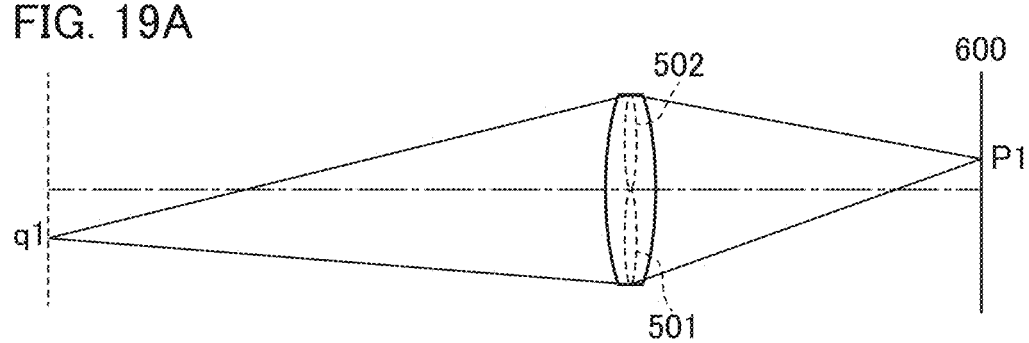
FIGS. 19A to 19C are diagrams for describing a principle of a depth change process.

The correspondence between pixels with different positions of the imaging element 1707 and pupil division is as shown in FIG. 19A. Luminous fluxes passing through different pupil partial areas (the pupil partial area 501 and the pupil partial area 502) pass through an imaging surface 600 and are incident on each pixel of the imaging element 1707 at different angles. Moreover, light is received by the sub-pixel 201 (the photoelectric conversion unit 301) and the sub-pixel 202 (the photoelectric conversion unit 302) of each pixel divided into 2×1 parts. In other words, the imaging element 1707 includes a plurality of pixels including a plurality of sub-pixels configured to receive luminous fluxes passing through different pupil partial areas of the image-forming optical system.

By using the imaging element 1707 with such a configuration, a first visual point image can be generated by collecting light reception signals of the sub-pixel 201 of each pixel and a second visual point image can be generated by collecting light reception signals of the sub-pixel 202 of each pixel. In other words, a plurality of visual point images can be generated for each different pupil partial areas from the input image acquired by each pixel of the imaging element 1707. Note that, in the embodiment, since the first visual point image and the second visual point image are Bayer array images, the demosaicing process may be applied to the first visual point image and the second visual point image if necessary. Furthermore, a captured image with a resolution of the effective number of pixels N can be generated by adding signals of the sub-pixel 201 and the sub-pixel 202 for each pixel of the imaging element 1707 and reading the added signals. In the embodiment, an example in which the captured image generated from the plurality of visual point images (the first visual point image and the second visual point image) is used will be described.

(Depth Change Process)

The depth change process according to the embodiment performed by the depth change processing unit 1855 will be described below. Note that the depth change process is a process of enlarging a depth of field.

Figure 19B:
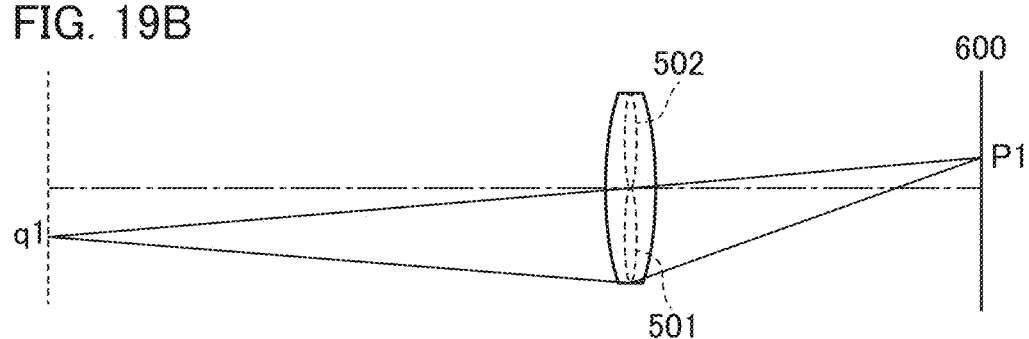
Figure 19C:
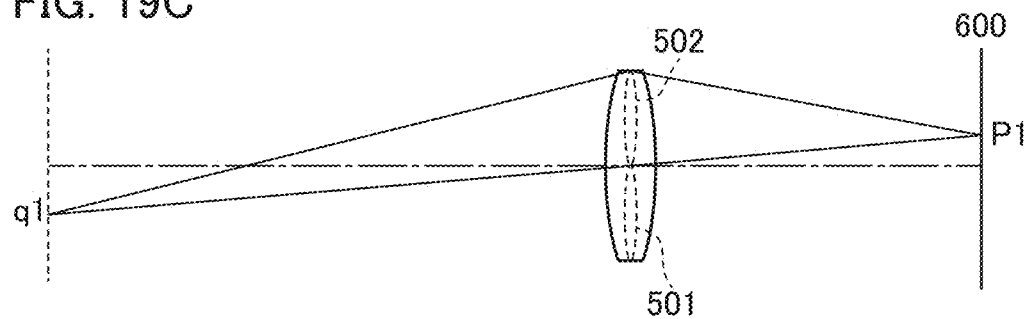

FIGS. 19A to 19C illustrate a principle of the depth change process. In FIGS. 19A to 19C, the imaging element 1707 (not shown in FIGS. 19A to 19C) is arranged in the imaging surface 600, and the exit pupil of the image-forming optical system is divided into the pupil partial area 501 and the pupil partial area 502.

FIG. 19A illustrates an in-focus image P1 of the main subject q1. Furthermore, FIGS. 19B and 19C illustrate an example in which luminous fluxes are divided into a luminous flux passing through the pupil partial area 501 of the image-forming optical system and a luminous flux passing through the pupil partial area 502 thereof. In FIG. 19B, a luminous flux from the main subject q1 passes through the pupil partial area 501 and forms an image as an image P1 in an in-focus state. Each of the luminous fluxes is received by the sub-pixel 201 of different pixels of the imaging element 1707 and thus a first visual point image is generated.

On the other hand, in FIG. 19C, a luminous flux from the main subject q1 passes through the pupil partial area 502 and forms an image as an image P1 in an in-focus state. Each of the luminous fluxes is received by the sub-pixel 202 of each pixel of the imaging element 1707 and thus a second visual point image is generated.

A process of changing, by the depth change processing unit 1855, an addition ratio of the first visual point image and the second visual point image to generating a combination image is the same as a process of changing, by the adjustment unit 326, the addition ratio of the first visual point image and the second visual point image to generate the combination image in the first embodiment. The depth change processing unit 1855 performs a combination by multiplying a weighting factor continuously changing in accordance with the area of the output image and each of a plurality of visual point images using the weighting factor, thereby generating an output image whose depth has been changed. Note that the above-described first visual point and second visual point images are input to the depth change processing unit 1855.

Note that, although a method of generating an output image in which a weighting factor (that is, an addition ratio) is changed in accordance with the user's designation will be described below, the user may designate a predetermined area on which the depth change process is performed.

(Depth Change Process for Pupil Shift)

Next, a pupil shift at a peripheral image height of the imaging element 1707 is as described with reference to FIGS. 11A to 11C.

Figure 20A:
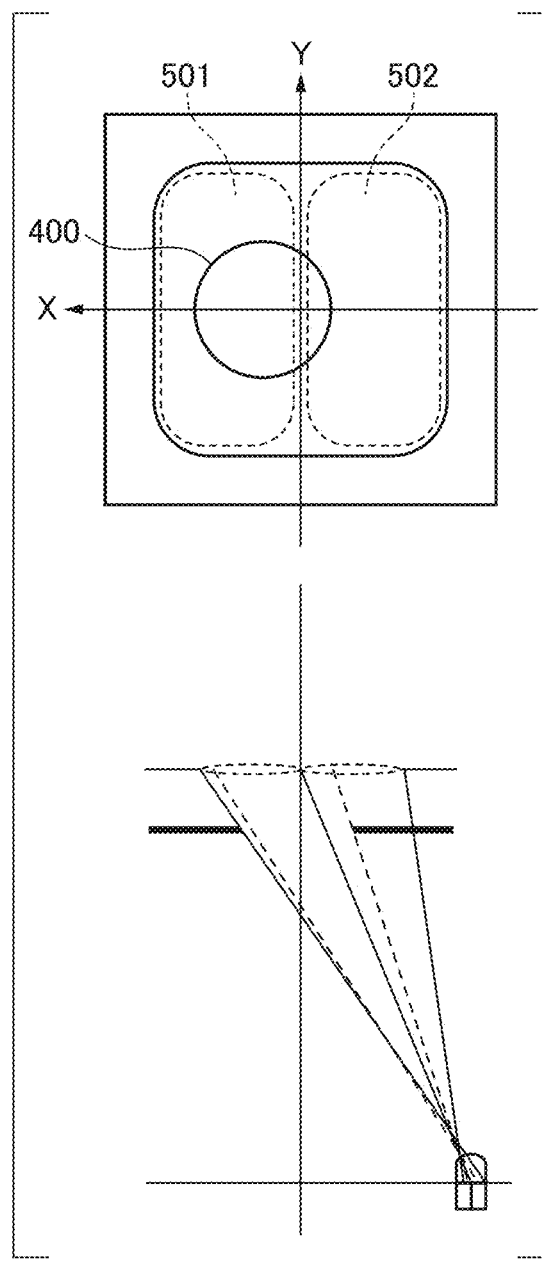
FIGS. 20A and 20B are diagrams for describing vignetting at the peripheral image height of the imaging element.
Figure 20B:
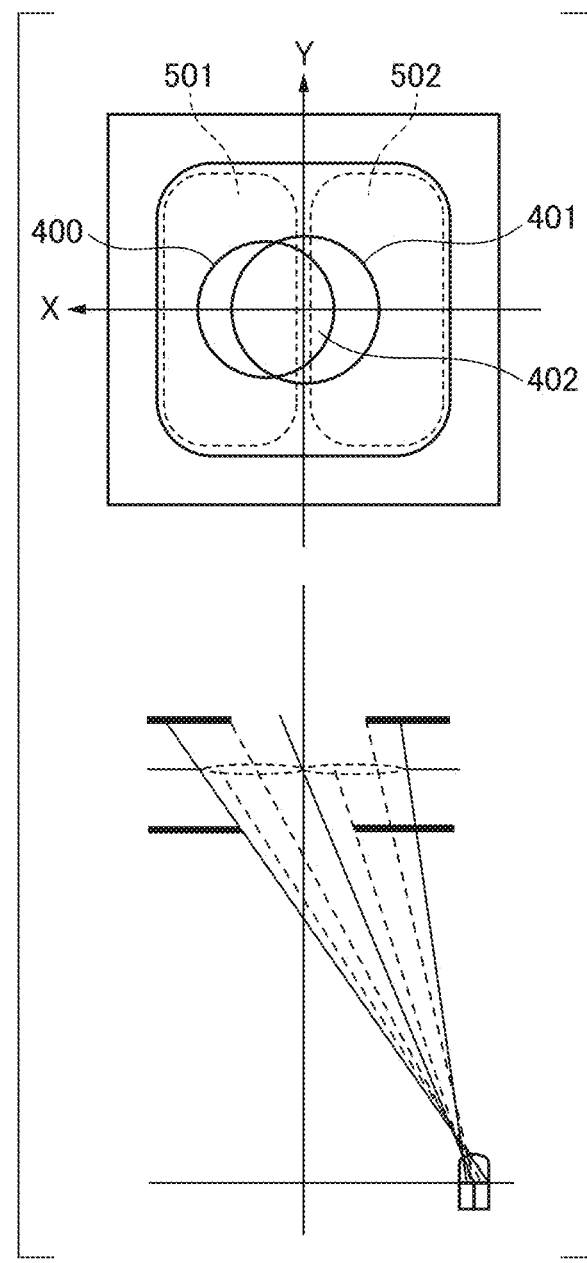

An actual aperture value (an effective aperture value) is different for each position of each imaging element. Like in FIG. 20A, when vignetting due to a single frame is caused, there is no change in aperture value for each position of each imaging element. However, like in FIG. 20B, there are a plurality of frames in an actual lens and an actual aperture value changes depending on the result of a plurality of frame vignettings. When such vignettings due to the lens is caused, it is generally known that the fall of an amount of light (the fall of a peripheral optical amount) occurs toward an image height of an end of the imaging element. Since such the fall of the peripheral optical amount is a value unique to each lens, there are many cameras having a function of storing information on the fall of the peripheral optical amount for each lens and correcting the image after photographing. It can be seen that vignetting due to a lens frame is caused as much as the amount of light falls using the information on the fall of the peripheral optical amount. For this reason, an effective aperture value for each image height of the imaging element can be predicted using the information on the fall of the peripheral optical amount.

An effective aperture value F at a time of peripheral optical amount fall information V(x,y) at an image height (x,y) of a certain imaging element can be calculated by the following Expression (5) using the photographing aperture value F.

$$F' = \frac{F}{f(V(x, y))} \quad \text{(Expression 5)}$$

Here, f(V(x,y)) is a function using V(x,y). Since an optimal functional form of f(V(x,y)) is different depending on a shape of the vignetting due to the lens, it is necessary to use a function appropriate for each lens. A case in which the shape of the vignetting is close to a circular shape (Expression (6)) and a case in which the shape of the vignetting is close to an ellipse (Expression (7)) will be illustrated below.

$$\text{circular model: } f(V(x,y)) = \sqrt{V(x,y)} \quad \text{(Expression 6)}$$

$$\text{elliptical model: } f(V(x,y)) = V(x,y) = V(x,y) \quad \text{(Expression 7)}$$

Although the above expression is expressed in an informal form, a plurality of functions can be considered for the purpose of high precision. It is as indicated in Expression (5) that an effective aperture value can be calculated using the information on the fall of the peripheral optical amount, and the functions forms in this case may not be limited to Expression (6) and Expression (7).

As described above, a magnitude relationship of an aperture value of each visual point image can be obtained by calculating an aperture value from the information on the fall of the peripheral optical amount of the first visual point image and the second visual point image.

(Depth of Field Change Processing)

Depth of field change processing by the depth change processing unit 1855 is the same as the depth of field change processing in the first embodiment. Since each visual point image is an image obtained when light passes through half of the original pupil region, an aperture diameter in the horizontal direction is halved in the case of a pupil division area divided into two parts in the horizontal direction. For this reason, the depth of field in the horizontal direction is quadrupled. On the other hand, since a configuration in which pupil division is performed in the vertical direction is not provided in the embodiment, there is no change in the depth of field in the vertical direction. Therefore, the first visual point image or the second visual point image is an image having the depth of field which is twice the depth of field of the image (the A+B image) obtained by combining the first visual point image and the second visual point image in a vertical/horizontal average.

As described above, the depth change processing unit 1855 can generate a combination image by changing the addition ratio of the first visual point image or the second visual point image to a ratio other 1:1 to generate an image in which the depth of field is changed. A predetermined area may be processed in accordance with the user's designation in the area in which the depth is changed. Note that, when the combination image generated from the visual point image is output from the depth change processing unit 1855, the above-described developing process is applied to the combination image and thus the combination image is output from the image processing unit 1725 as an image to which the developing process is applied.

FIGS. 21A to 21C are diagrams for describing a conjugate relationship between the exit pupil plane of a photographing optical system and the photoelectric conversion unit of the imaging element 1707 arranged near a zero image height (that is, in the vicinity of the center of the image plane) in the digital camera 1700. The photoelectric conversion unit in the imaging element 1707 and the exit pupil plane of the photographing optical system are designed to have a conjugate relationship using an on-chip microlens. Moreover, the exit pupil of the photographing optical system generally coincides substantially with a surface in which an iris diaphragm configured to adjust an amount of light is set. On the other hand, although the photographing optical system according to the embodiment is a zoom lens having a zooming function, when a zooming operation is performed depending on an optical type, the distance from the image plane of the exit pupil or a magnitude of the exit pupil change. In the photographing optical system in FIGS. 21A to 21C, a focal length is in the middle of a wide angle end and a telephoto end, that is, in a middle state. Assuming this as a standard exit pupil distance Zep, an optimum design of eccentricity parameters according to the shape of the on-chip microlens or an image height (X and Y coordinates) is performed.

FIG. 21A illustrates the first lens group 1701, a barrel member 101b configured to hold the first lens group 1701, the third lens group 1705, and a barrel member 105b configured to hold the third lens group 1705. Furthermore, the shutter 1702, a diaphragm plate 102a configured to define an aperture diameter when the diaphragm of the shutter 1702 is opened, and a diaphragm blade 102b configured to adjust an aperture diameter when the shutter 1702 is narrowed are also illustrated. Note that an optical virtual image is observed on the image plane through the barrel member 101b, the diaphragm plate 102a, the diaphragm blade 102b, and the barrel member 105b acting as a restriction member of a luminous flux passing through the photographing optical system. Furthermore, a combination aperture in the vicinity of the shutter 1702 is defined as the exit pupil of the lens, and the distance from the image plane is set as Zep as described above.

Pixels configured to photoelectrically convert a signal of a subject image are constituted of members, i.e., the photoelectric conversion units 301 and 302, wiring layers 303a to 303c, the color filter 306, and the microlens 305 from the bottom layer. Moreover, the exit pupil plane of the photographing optical system is projected onto two photoelectric conversion units using the microlens 305. In other words, the image passing through the exit pupil of the photographing optical system is projected onto a surface of the photoelectric conversion unit via the microlens 305.

Since FIG. 21B illustrates an image of the photoelectric conversion unit projected onto the exit pupil plane of the photographing optical system, the projected images of the photoelectric conversion units 301 and 302 are EP1a and EP1b. EP1a corresponds to the projected image of the first visual point image and EP1b corresponds to the projected imaged of the second visual point image.

Here, when the shutter 1702 is open (for example, F2.8), the outermost part of a luminous flux passing through the photographing optical system is indicated by L (F2.8), and the projected images EP1a and EP1b are not subjected to the vignetting of a diaphragm aperture. On the other hand, when the shutter 1702 has a small aperture (for example, F5.6), the outermost part of a luminous flux passing through the photographing optical system is indicated by L (F5.6), and the outer sides of the projected images EP1a and EP1b are subjected to the vignetting of a diaphragmaperture. Here, the vignetting of the projected images EP1a and EP1d is symmetrical with respect to the optical axis at the center of the image plane, and amounts of light received by the photoelectric conversion units 301 and 302 are the same.

FIG. 21C illustrates light receiving characteristics in a cross section taken along line A-A of FIG. 21B, a horizontal axis represents a horizontal coordinate in the exit pupil plane of the photographing optical system, and a vertical axis represents light receiving efficiency of the photoelectric conversion unit. It has been described with reference to FIG. 21A that the photoelectric conversion unit arranged in a pixel is in a conjugate relationship with the exit pupil of the photographing optical system using the microlens. This means that only the luminous flux passing through the exit pupil TL2 (FIG. 21B) of the photographing optical system in the exit pupil plane and the common area of the projected image EP of the photoelectric conversion unit reaches the photoelectric conversion unit. Therefore, the projected image corresponds to a pixel-specific aperture stop arranged in the exit pupil plane of the photographing optical system, and a vertical axis of FIG. 21C indicates a transmittance distribution of each aperture stop. Moreover, such a transmittance distribution can be regarded as luminous flux receiving efficiency of the photoelectric conversion unit. The distribution characteristics of such luminous flux receiving efficiency will be referred to as a "pupil intensity distribution" for the sake of convenience.

Here, when the projection performance using the microlens is geometrically optically aberrational, a pupil intensity distribution has a step function with only one value of zero and 1. However, since a dimension of each pixel is as small as about several micrometers, the sharpness of the image of the photoelectric conversion unit projected onto the exit pupil plane is reduced due to diffraction of light. Furthermore, since the microlens is usually a spherical lens, the sharpness of the projected image is also reduced due to spherical aberration. Thus, blur is also caused due to a pupil intensity distribution of each pixel, and the shoulder portions at both ends are rounded and have a shape with a skirt as shown in FIG. 21C.

A relationship between a pupil intensity distribution and focus detection characteristics will be described below. In a pair of pupil intensity distributions in the x axis direction, an amount of separation of the center of gravity of each part cut in an exit pupil range of the photographing optical system corresponds to a base line length in a phase difference type focus detection system. Here, the base line length is defined as an angle θ (unit:radian) obtained by dividing an amount of separation (unit:mm) of the center of gravity in the pupil plane of the photographing optical system by a pupil distance (unit:mm). Moreover, when an amount of image shift of a 1:2 image at a time of focus detection is set to u (unit:mm) and an amount of defocus at that time is set to dz (unit:mm), these relationships are expressed by the following Expressions (8) and (9).

$$\theta \times dz = u \quad \text{(Expression 8)}$$

$$Dz = u \times (1/\theta) = u \times K \quad \text{(Expression 9)}$$

Here, K is a coefficient defined as the reciprocal of a baseline angle θ.

K is an image plane movement amount conversion coefficient of the embodiment. θ takes different values for each F number of the photographing optical system. In addition, in FIG. 21C, the baseline angles of F2.8 and F5.6 are indicated by θ(F2.8) and θ(F5.6). According to Expression (8), an amount of image shift of a focus detection image with respect to a unit amount of defocus is larger when a baseline angle θ is larger, and thus focus detection accuracy is higher.

As described above, a base line length of the projected image EP1a+EP1d (the A+B image) serving as the projected image obtained through the added photoelectric conversion units 301 and 302 and EP1a (the first visual point image) serving as the projected image of the photoelectric conversion unit 301 is defined as an angle θ1 (unit:radian) obtained by dividing an amount of separation (unit:mm) of the center of gravity in the pupil plane of the photographing optical system by a pupil distance (unit:mm). Moreover, when an amount of image shift of a 1:2 image at a time of focus detection is set to u (unit:mm) and an amount of defocus at that time is set to dz1 (unit:mm), these relationships are expressed by the following Expressions (10) and (11).

$$\theta 1 \times dz1 = u \quad \text{(Expression 10)}$$

$$dz1 = u \times (1/\theta 1) = u \times K1 \quad \text{(Expression 11)}$$

Here, K1 is a coefficient defined as the reciprocal of a baseline angle θ1.

K1 is an image plane movement amount conversion coefficient of the A+B image and the first visual point image and is set to a first image plane movement amount conversion coefficient.

In addition, a base line length of the projected image EP1a+EP1d (the A+B image) serving as the projected image obtained through the added photoelectric conversion units 301 and 302 and EP1b (the second visual point image) serving as the projected image of the photoelectric conversion unit 302 is defined as an angle θ2 (unit:radian) obtained by dividing an amount of separation (unit:mm) of the center of gravity in the pupil plane of the photographing optical system by a pupil distance (unit:mm). Moreover, when an amount of image shift of a 1:2 image at a time of focus detection is set to u (unit:mm) and an amount of defocus at that time is set to dz2 (unit:mm), these relationships are expressed by the following Expressions (12) and (13).

$$\theta 2 \times dz2 = u \quad \text{(Expression 12)}$$

$$dz2 = u \times (1/\theta 2) = u \times K2 \quad \text{(Expression 13)}$$

Here, K2 is a coefficient defined as the reciprocal of a baseline angle 82.

K2 is an image plane movement amount conversion coefficient of the A+B image and the second visual point image and is set to a second image plane movement amount conversion coefficient.

As described above, such image plane movement amount conversion coefficients are the reciprocals of baseline angles θ and each of the baseline angles corresponds to an F number. The smaller the baseline angle is, the larger the F number becomes. Here, comparing a value of the first image plane movement amount conversion coefficient K1 serving as the image plane movement amount conversion coefficient of the A+B image and the first visual point image with a value of the second image plane movement amount conversion coefficient K2 serving as the image plane movement amount conversion coefficient of the A+B image and the second visual point image means comparing aperture values. When an aperture value of the first visual point image is set to F1 and an aperture value of the second visual point image is set to F2, F1>F2 is satisfied when a magnitude relationship of K1>K2 is satisfied and F1<F2 is satisfied when a magnitude relationship of K1<K2 is satisfied. As described above, a magnitude relationship of the aperture values of the first visual point image and the second visual point image can be obtained through a comparison of a magnitude relationship between the image plane movement amount conversion coefficient K1 of the A+B image and the first visual point image and the image plane movement amount conversion coefficient K2 of the A+B image and the second visual point image.

An image plane movement amount conversion coefficient can be calculated when the information on the pupil, the aperture value, the exit pupil distance, and the image height of the imaging element described above is known. The image plane movement amount conversion coefficient can be used by calculating the image plane movement amount conversion coefficient in advance, storing the image plane movement amount conversion coefficient in the digital camera, or computing the image plane movement amount conversion coefficient in the digital camera 1700.

(Series of Operations Associated with Depth Change Operation of Captured Image)

Figure 22:
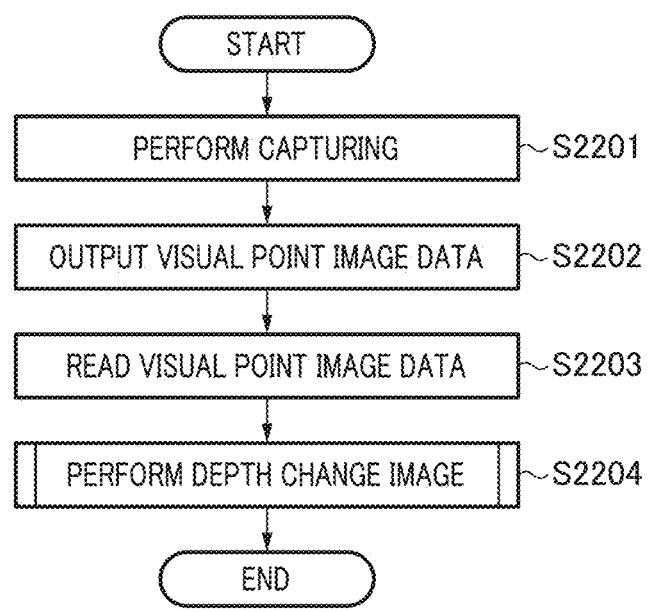
FIG. 22 is a flowchart for describing a series of operations associated with a depth change of a captured image.

A series of operations associated with a depth change of a captured image will be described below with reference to FIG. 22. Note that a process of a flowchart of FIG. 22 is started, for example, when a release switch or the like included in the operation unit 1732 is pressed by the user. Furthermore, unless otherwise stated, the process of each step of the flowchart is realized when the controller 1721 develops a program stored in a ROM (not shown) in a working area of a RAM, executes the program, and controls each unit such as the image processing unit 1725.

In S2201, the imaging element 1707 performs imaging in accordance with an instruction from the controller 1721. In S2202, the imaging element 1707 outputs visual point image data. To be specific, the imaging element 1707 outputs the above-described A+B image and the first visual point image (the A image) as visual point image data of one file format. Furthermore, the recording medium 1733 temporarily stores the visual point image data output from the imaging element 1707.

In S2203, the image processing unit 1725 reads the visual point image data in accordance with an instruction from the controller 1721. For example, the image processing unit 1725 acquires the visual point image data stored in the recording medium 1733 using the image acquisition unit 1851. At this time, the image processing unit 1725 generates a B image from the A+B image and acquires, for example, the first visual point image (the A image) serving as an image of the left visual point and the second visual point image (the B image) serving as an image of the right visual point.

In S2204, the controller 1721 controls the operation unit 1732 and the image processing unit 1725 to perform depth change image processing to be described below, that is, a depth change on the captured image. The controller 1721 ends the process of the flowchart when the depth change image processing is completed.

(Series of Operations Associated with Depth Change Image Processing)

A series of operations associated with the depth change image processing in S2204 will be described below with reference to the flowchart illustrated in FIG. 23. Note that, in the following description, an operation in the UI (depth change UI) for changing a depth of field is illustrated.

In S2301, the controller 1721 causes the display unit 1731 to display the UI having the depth change UI and a photographed image.

In S2302, the controller 1721 determines whether the depth change is performed on the basis of a user operation input through the operation unit 1732. When the depth change is instructed to be performed through the input user operation, the controller 1721 moves the process to a process of S2303. On the other hand, when the depth change is not instructed to be performed through the input user operation, the controller 1721 returns the process to a process of the main flowchart (FIG. 22).

Figure 24A:
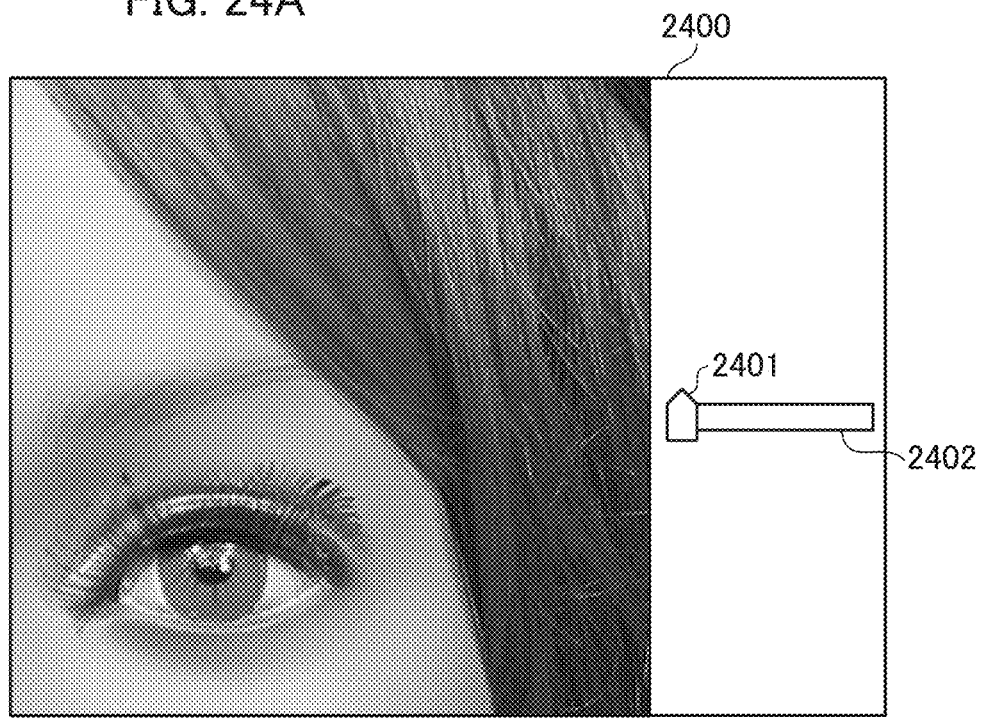
FIGS. 24A and 24B are diagrams illustrating an example of a depth change UI.
Figure 24B:
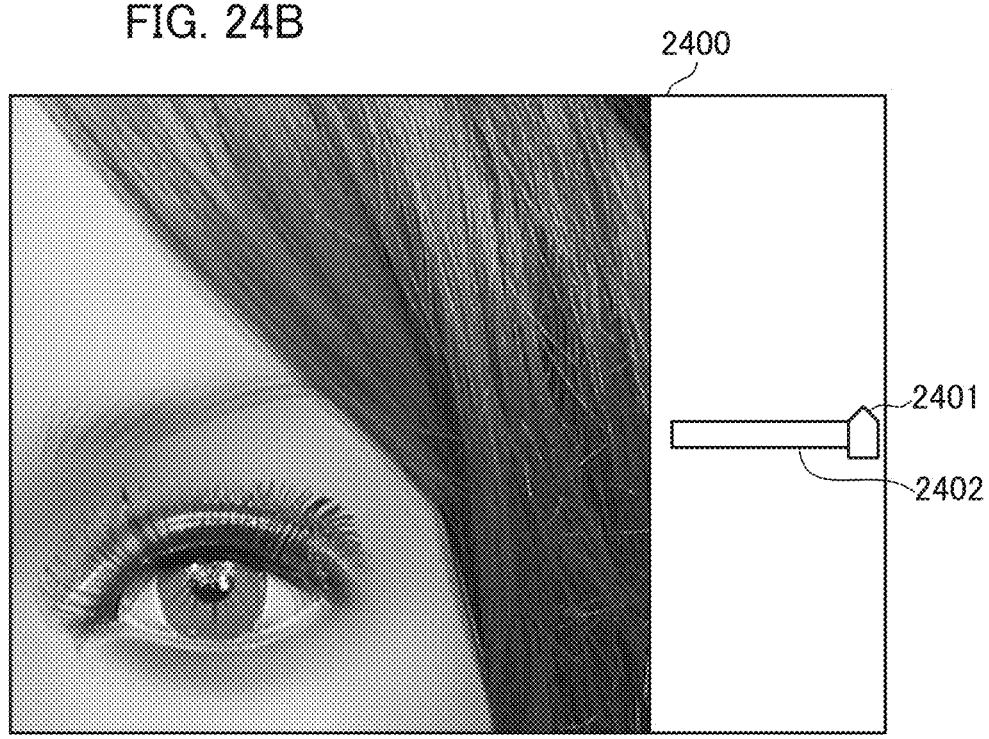

In S2303, the controller 1721 (an area designation means) further acquires a user operation of operating the UI for selecting an area subjected to a depth change from a photographed image through the operation unit 1732. Here, FIGS. 24A and 24B illustrate an example of the depth change UI displayed on the display unit 1731. In the example of FIG. 24A, the controller 1721 displays an image in a partial area 2400 constituting the UI. When the user selects an area (an area to be processed) in which a depth is desired to be changed, the process proceeds to a process of S2304.

In S2304, the controller 1721 further acquires a user operation for operating the depth change UI through the operation unit 1732. In the depth change UI, the slider 2401 and the slider bar 2402 are arranged in the horizontal direction. The user moves the slider 2401 to a position in which a depth is desired to be changed, and the controller 1721 acquires operation information (depth designation information) through the operation unit 1732.

In S2305, the controller 1721 determines whether the designated depth is greater than a predetermined value. When it is determined that the designated depth is greater than the predetermined value, the process proceeds to a process of S2306, and when it is not determined that the designated depth is greater than the predetermined value, the process proceeds to a process of S2307. The predetermined value is a depth of field corresponding to a smaller (brighter) aperture value between an aperture value of the first visual point image and an aperture value of the second visual point image. The visual point image having a small aperture value can be determined using the exit pupil distance of the image-forming optical system and the set pupil distance of the imaging element 1707, the photographing aperture value and the image height at which the depth is changed, the information on the fall of the peripheral optical amount, and the image plane movement amount conversion coefficient of each visual point image as described above. Information necessary for performing such determination may be held in advance in the digital camera 1700 and may be received by the digital camera 1700 through the Internet.

In S2306, the controller 1721 identifies a visual point image having a larger depth (aperture value). Moreover, the controller 1721 increases a proportion of a visual point image having a larger depth (aperture value), combines a partial area (the area designated in S2303) of the visual point image, and generates a depth change image. As described above, a magnitude relationship between the aperture value of the first visual point image and the aperture value of the second visual point image changes due to the exit pupil distance of the image-forming optical system and the set pupil distance of the imaging element 1707, the photographing aperture value and the image height at which the depth is changed, the information on the fall of the peripheral optical amount, and the image plane movement amount conversion coefficient of each visual point image. When the designated depth is larger than a predetermined value, in order to obtain an image with the designated depth, it is necessary to perform a combination of a visual point image using a visual point image having a larger aperture value as a main. Note that combining a visual point image "using, as a main," a specific visual point image means that a combination is performed with a combination ratio having the highest proportion of such a specific visual point image.

In S2307, the controller 1721 identifies a visual point image having a smaller depth (aperture value). Moreover, the controller 1721 increases a proportion of a visual point image having a smaller depth (aperture value), combines a partial area (the area designated in S2303) of the visual point image, and generate a depth change image. Note that, the depth change is a predetermined value or less, an image with a designated depth can be obtained even when a combination of a visual point image is performed using any of the first visual point image and the second visual point image as a main. Therefore, the processes of S2305 and S2307 will be omitted and the digital camera 1700 may be configured to perform the process of S2307 irrespective of the designated depth. However, when the processes of S2305 and S2307 are provided, a signal to noise (S/N) ratio of the depth change image can be improved. This is because an amount of light of the visual point image having the smaller depth (aperture value) is larger than that of the visual point image having the larger depth (aperture value), and thus noise is generally small. Furthermore, the predetermined value may be the depth (a first depth of field) equal to or less than the depth of field corresponding to the smaller (brighter) aperture value and may not necessarily coincide with the depth of field corresponding to the smaller (brighter) aperture value. In this case, even when the designated depth is in a range which can be realized by performing a combination of the visual point image using the visual point image having the smaller aperture value as a main, a combination of the visual point image is performed using the visual point image having the larger aperture value as a main when the designated depth exceeds the predetermined value.

In S2308, the controller 1721 performs the developing process. The developing process has been described with reference to FIG. 16 in the first embodiment. In S2309, the controller 1721 displays an image, ends the depth change image processing, and returns the process to the process of the main flowchart (FIG. 22).

Figure 25A:
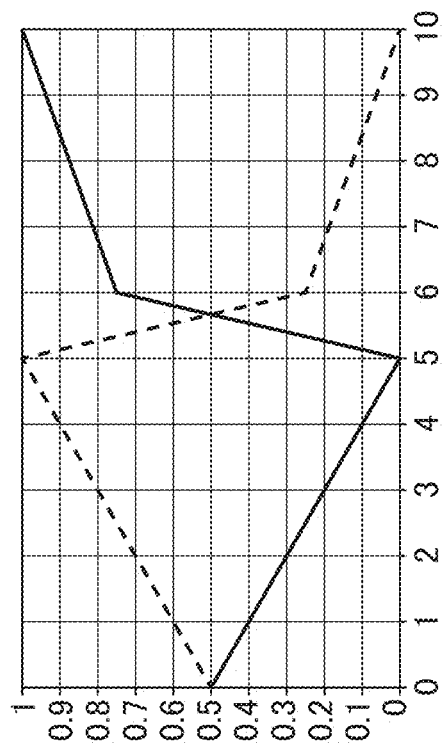
FIGS. 25A and 25B are diagrams illustrating an example of a relationship between a slider bar operation and a combination ratio of first and second visual point images.
Figure 25B:
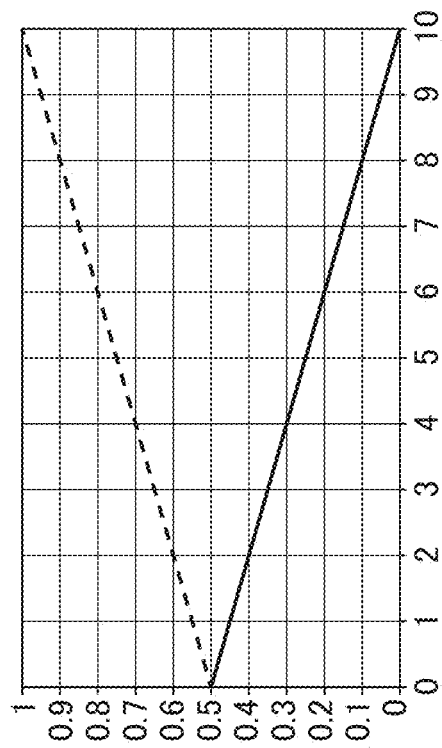

FIGS. 25A and 25B are diagrams illustrating an example of a relationship between a slider bar operation and a combination ratio between first and second visual point images. In FIGS. 25A and 25B, vertical axes indicate a ratio of each visual point and horizontal axes indicate a scale of a slider bar. In the scale of the slider bar, "0" corresponds to a depth of an A+B image and "10" corresponds to a depth of a visual point image having a larger (deeper) depth between the first visual point image and the second visual point image. A dotted line corresponds to the first visual point image and a solid line corresponds to the second visual point image. FIG. 25A illustrates a case in which the depths (aperture values) of the first visual point image and the second visual point image are the same, and FIG. 25B illustrates a case in which the depth (aperture value) of the second visual point image is larger than that of the first visual point image.

In the case of FIG. 25A, even when a combination is performed using any of the first visual point image and the second visual point image as a main, there is no substantial difference in an adjustable range of the depth, the S/N ratio, and the like. Thus, the controller 1721 continuously increases a ratio of either the first visual point image and the second visual point image as a value of the scale of the slider bar increases to change the depth.

In the case of FIG. 25B, the controller 1721 performs a combination using the first visual point image as a main until the designated depth reaches a predetermined value to change the depth. Here, although it is assumed that the scale "5" corresponds to a predetermined value of a depth (that is, an aperture value of the first visual point image), a value of the scale corresponding to the predetermined value of the depth changes in accordance with a ratio between an aperture value of the first visual point image and an aperture value of the second visual point image. When the designated depth exceeds a predetermined value, the controller 1721 performs a combination using the second visual point image as a main to change the depth.

A depth (an F number) which can be realized through the combination of the first and second visual point images can be calculated from the information on the fall of the peripheral optical amount. The F numbers of the A+B image, the first visual point image, and the second visual point image are set to Fab, F1, and F2, respectively, and amounts of light thereof are represented as Yab, Y1, and Y2, respectively. An amount of light is a function of a horizontal image height x and a vertical image height y, and the controller 1721 calculates coefficients of functions of amounts of light of the first visual point image and the second visual point image using the shading processing unit 1853.

As described above, the F numbers of the first visual point image and the second visual point image are expressed by the following Expressions (14A) and (14B).

$$F1 = Fab \times \sqrt{\frac{Yab}{Y1}} \qquad \text{(Expression 14A)}$$

$$F2 = Fab \times \sqrt{\frac{Yab}{Y2}} \qquad \text{(Expression 14B)}$$

When an F number in a case in which a ratio of the first visual point image is set to $\alpha$ ($0 \leq \alpha \leq 1$) is set to $F(\alpha)$, the following Expression (15) is obtained.

$$F(\alpha) = Fab \times \sqrt{\frac{Yab}{\alpha Y1 + (1-\alpha)Y2}} \qquad \text{(Expression 15)}$$

The controller 1721 calculates $\alpha$ which is $F(\alpha)$=(the designated depth (an F number)) on the basis of Expression (14). Thus, the ratios of the first and second visual point images can be obtained. Moreover, the controller 1721 calculates weighting factors Wa and Wb of the first and second visual point images in accordance with Expressions (2A) and (2B) described above. Note that, in Expressions (2A) and (2B), w=1-2$\alpha$. Moreover, the controller 1721 can generate a combination image in accordance with the above-described Expression (3) to obtain an image with the designated depth.

As described above, the depth change illustrated in FIGS. 25A and 25B can be performed by calculating an F number according to a combination ratio of the first visual point image and the second visual point image.

Incidentally, as described above, an F number (an effective F number) of each visual point image varies in accordance with an image height. Thus, in the embodiment, as will be described in detail below, when a depth change area designated in S2303 of FIG. 23 exceeds a predetermined size (threshold value), the controller 1721 divides the depth change area to have a predetermined size or less and performs the processes of S2305 to S2307 on each of the divided areas.

Figure 26:
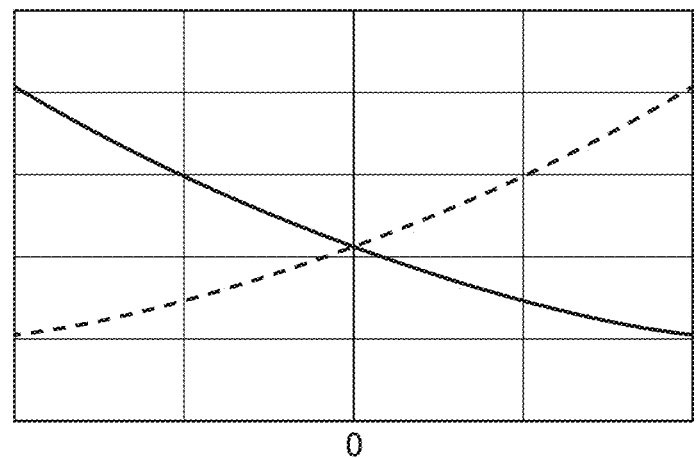
FIG. 26 is a diagram illustrating an example of a relationship between an image height and an effective F number of first and second visual point images.

FIG. 26 is a diagram illustrating an example of a relationship between an image height and an effective F number of first and second visual point images. In FIG. 26, a vertical axis represents an effective F number and a horizontal axis represents a horizontal image height. Furthermore, a solid line corresponds to a first visual point image and a dotted line corresponds to a second visual point image. The example of FIG. 26 is an example in which depths of the first visual point image and the second visual point image are different for each image height.

In the example of FIG. 26, a case in which the user designates an area with a predetermined size or less (a threshold value or less) (for example, 5% in a horizontal direction and 5% in a vertical direction of the full image height) as a depth change area can be thought. In this case, the controller 1721 uniformly determines a ratio between the first visual point image and the second visual point image with respect to the designated area. Thus, it is possible to change the depth with substantially the same effective F number for the entire depth change area.

When the user designates a large area (for example, 80% in the horizontal direction and 80% in the vertical direction of the full image height) as a depth change area, the controller 1721 divides the designated area for each image height. Moreover, the controller 1721 determines a ratio between the first visual point image and the second visual point image for each divided area so that the entire designated area has substantially the same effective F number. In the example of FIG. 26, when the designated depth is a predetermined value or less, the controller 1721 increases a ratio of the first visual point image or the second visual point image at a central image height, increases a ratio of the first visual point image at a right image height, and increases a ratio of the second visual point image at a left image height.

As described above, according to the first embodiment, the digital camera 1700 combines the first visual point image and the second visual point image at a combination ratio corresponding to the depth designated by the user. In this way, the digital camera 1700 according to the embodiment adjusts the depth of field of the combination image using a difference in the aperture value.

Third Embodiment

In the second embodiment, a description has been provided using a configuration in which each pixel of the imaging element 1707 is divided into two parts in the horizontal direction as an example. However, the form of pixel division is not limited to that illustrated in FIG. 3. In the third embodiment, a description will be provided using a configuration in which each pixel of the imaging element 1707 is divided into two parts in the horizontal direction and two parts in the vertical direction as an example. Other configurations of the digital camera 1700 are substantially the same as the second embodiment. Differences of the third embodiment from the second embodiment will be mainly described below.

Figure 27:
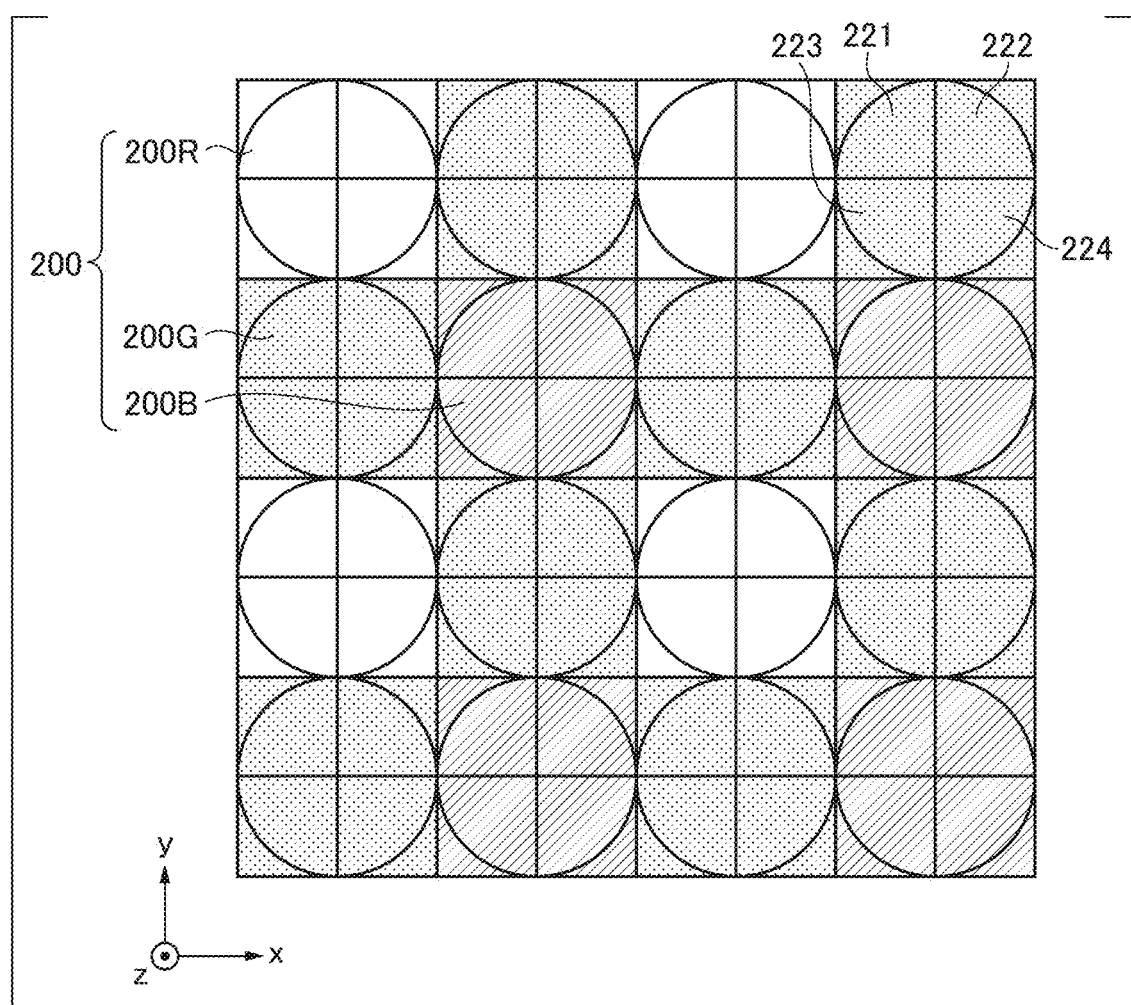
FIG. 27 is a diagram for describing an arrangement of a pixel and a sub-pixel.

FIG. 27 is a diagram for describing an arrangement of pixels and sub-pixels of the imaging element 1707 according to the third embodiment. FIG. 27 illustrates the arrangement of pixels in a range of 4 columns×4 rows and the arrangement of sub-pixels in a range of 8 columns×8 rows of the imaging element 1707 according to the embodiment.

In the embodiment, in a pixel group 200 with 2 columns×2 rows illustrated in FIG. 27, a pixel 200R with spectral sensitivity of R (red), pixels 200G with spectral sensitivity of G (green), and a pixel 200B with spectral sensitivity of B (blue) are arranged at the upper left, the upper right and lower left, and the lower right, respectively.

In addition, each pixel is constituted of sub-pixels 221 to 224 arranged in 2 columns×2 rows.

The imaging element 1707 includes a plurality of pixels with 4 columns×4 rows (sub-pixels with 8 columns×8 rows) arranged in a surface thereof illustrated in FIG. 27 and can acquire a captured image (or a visual point image). For example, in the imaging element 1707, a period P in which pixels are arranged is 4 μm, the number of pixels N is 5575 columns in a horizontal direction×3725 rows in a vertical direction=about 20.75 million pixels, a period PS of sub-pixels is 2 μm, and the number of sub-pixels NS is 11150 columns in a horizontal direction×7450 rows in a vertical direction=about 83.00 million pixels.

Figure 28A:
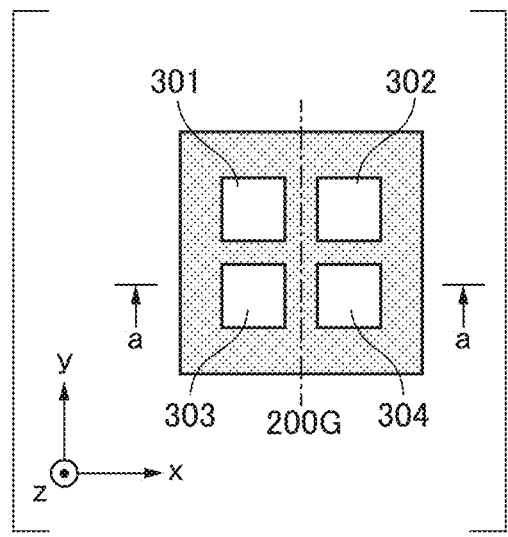
FIGS. 28A and 28B are a schematic plan view and a schematic cross-sectional view of a pixel.
Figure 28B:
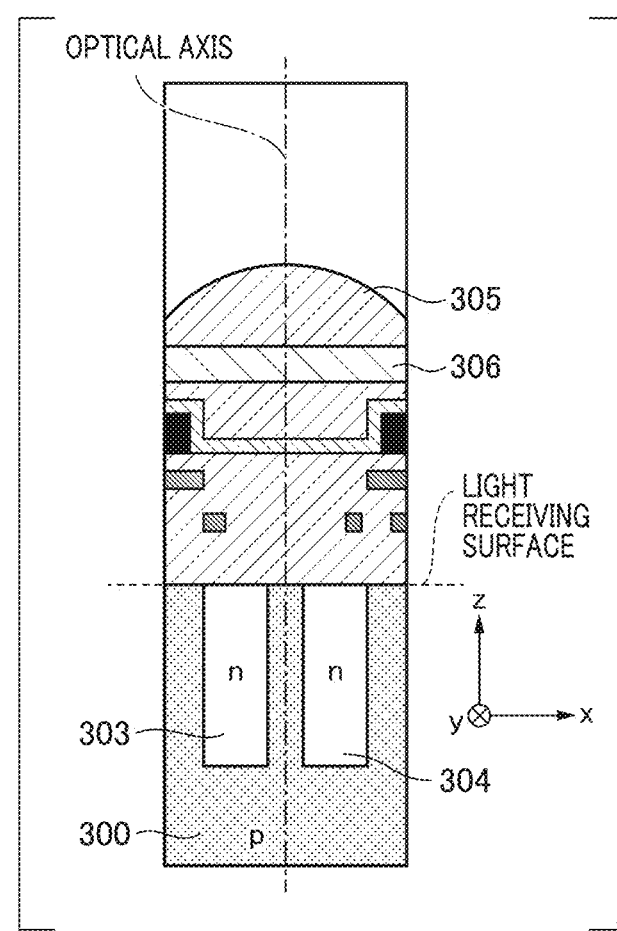

A structure of the pixel 200G illustrated in FIG. 27 will be described in more detail with reference to FIGS. 28A and 28B. FIG. 28A is a plan view of the pixel 200G viewed from a light receiving surface side (a +z side) of the imaging element 1707, and FIG. 28B is a cross-sectional view of a cross section taken along line a-a in FIG. 28A viewed from a −y side. As shown in FIG. 28A, in the pixel 200G according to the embodiment, the photoelectric conversion units 301 to 304 which are subjected to an NH division (a 2 division) in the x direction and an NV division (a 2 division) in the y direction. The photoelectric conversion units 301 to 304 correspond to the sub-pixels 221 to 224.

In the embodiment, the first visual point image is generated by collecting a light reception signal of the sub-pixel 201 of each pixel. Similarly, the second visual point image is generated by collecting a light reception signal of the sub-pixel 202 of each pixel, a third visual point image is generated by collecting a light reception signal of a sub-pixel 203 of each pixel, and a fourth visual point image is generated by collecting a light reception signal of a sub-pixel 204 of each pixel. Note that, in the embodiment, the first visual point image to the fourth visual point image are Bayer array images, and the demosaicing process may be performed on the first visual point image to the fourth visual point image if necessary.

j and i are set to integers, a position of a $j^{th}$ row in a row direction of the imaging element 1707 and an $i^{th}$ row in a row direction is set as (j,i), a first visual point image of a pixel of a position (j, i) is set as A(j, i), a second visual point image is set as B(j, i), a third visual point image is set as C(j, i), and a fourth visual point image is set as D(j, i). At this time, a captured image I is I(j, i)=A(j, i)+B(j, i)+C(j, i)+D(j, i).

(Depth Change Process)

The depth change processing unit 1855 calculates a weighting factor of each visual point image in accordance with Expressions (16A) to (16D) as a real coefficient w(−1≤w≤1).

$$W_a(j,i)=1+w_a T(j,i) \quad \text{(Expression 16A)}$$

$$W_b(j,i)=1+w_b T(j,i) \quad \text{(Expression 16B)}$$

$$W_c(j,i)=1+w_c T(j,i) \quad \text{(Expression 16C)}$$

$$W_d(j,i)=1+w_d T(j,i) \quad \text{(Expression 16D)}$$

Here, Wa(j, i) is a first weighting factor of a first visual point image A(j, i), and Wb(j, i) is a second weighting factor of a second visual point image B(j, i). Furthermore, Wc(j, i) is a third weighting factor of a third visual point image C(j, i), and Wd(j, i) is a fourth weighting factor of a fourth visual point image D(j, i). Moreover, Wa+Wb+Wc+Wd=0.

The depth change processing unit 1855 generates an output image I(j, i) in accordance with Expression (17) from a weighting factor corresponding to each visual point image.

$$I(j,i)=W_a(j,i)*A(j,i)+W_b(j,i)*B(j,i)+W_c(j,i)*C(j,i)+W_d(j,i)*D(j,i) \quad \text{(Expression 17)}$$

Note that a method of determining Wa, Wb, Wc, and Wd is the same as the method of determining Wa and Wb in the first embodiment, and Expression (15) may be expanded in the case of four visual point images.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-012065, filed Jan. 26, 2017, Japanese Patent Application No. 2017-043064, filed Mar. 7, 2017, which are hereby incorporated by reference wherein in their entirety.

What is claimed is:

1. An image processing apparatus comprising:
a memory;
at least one processor, the processor executing the following functions in accordance with a program stored in the memory;
an acquisition unit configured to acquire a plurality of visual point images;
an image processing unit configured to perform image processing on image data based on the plurality of visual point images to generate a combination image;
a designation unit configured to designate an area subjected to the image processing using the image processing unit; and
an adjustment unit configured to set an adjustable range of the image processing for each area designated by the designation unit, wherein the adjustment unit sets an adjustable range of an area other than the area subjected to the image processing to be smaller than an adjustable range of the area subjected to the image processing.

2. The image processing apparatus according to claim 1, wherein the designation unit designates the area on the basis of designation from a user, and the designation from the user is designation of an area subjected to the image processing or designation of an area not subjected to the image processing.

3. The image processing apparatus according to claim 1, wherein the image processing unit combines the plurality of visual point images to generate the combination image and determines an addition ratio of the plurality of visual point images for each area on the basis of an adjustment value designated in a range of the adjustable range set for each area.

4. The image processing apparatus according to claim 3, wherein the image processing unit determines an addition ratio of the plurality of visual point images in a boundary area of a predetermined area subjected to the image processing on the basis of an adjustment value of a predetermined area and an adjustment value of an area adjacent to the predetermined area.

5. The image processing apparatus according to claim 3, further comprising:

a user interface configured to designate the adjustment value by a user operation within the adjustable range.

6. The image processing apparatus according to claim 1, wherein the image processing is processing of visual point movement.

7. The image processing apparatus according to claim 1, wherein the image processing is a refocusing process or a process of changing a depth of field.

8. The image processing apparatus according to claim 1, further comprising:

an output unit configured to output an image used to allow the user to designate an area subjected to the image processing and a user interface configured to indicate the adjustable range to a display device.

9. The image processing apparatus according to claim 8, wherein the image processing unit combines the plurality of visual point images to generate the combination image and determines an addition ratio of the plurality of visual point images for each area on the basis of an adjustment value, wherein the user interface designates the adjustment value by a user operation within the adjustable range.

10. An imaging apparatus comprising:
an image processing apparatus; and
an imaging element configured to capture a subject,
wherein the image processing apparatus includes:
a memory;
at least one processor, the processor executing the following functions in accordance with a program stored in the memory;
an acquisition unit configured to acquire a plurality of visual point images;
an image processing unit configured to perform image processing on image data based on the plurality of visual point images to generate a combination image;
a designation unit configured to designate an area subjected to the image processing using the image processing unit; and
an adjustment unit configured to set an adjustable range of the image processing for each area designated by the designation unit, wherein the adjustment unit sets an adjustable range of an area other than the area subjected to the image processing to be smaller than an adjustable range of the area subjected to the image processing.

11. The imaging apparatus according to claim 10, wherein the imaging element includes a plurality of microlenses and a plurality of photoelectric conversion units, and each of the microlenses corresponds to one of the plurality of photoelectric conversion units, and the plurality of visual point images based on signals are output by the plurality of photoelectric conversion units corresponding to each of the microlenses.

12. An image processing method comprising:
acquiring a plurality of visual point images;
designating an area subjected to image processing;
setting an adjustable range of the image processing for each designated area; and
acquiring an adjustment value set in a range of the adjustable range for each area, performing image processing on image data based on the plurality of visual point images on the basis of the adjustment value, and generating a combination image,
wherein the adjustment unit sets an adjustable range of an area other than the area subjected to the image processing to be smaller than an adjustable range of the area subjected to the image processing.

13. A non-transitory recording medium storing a control program of an image processing apparatus causing a computer to perform each step of an image processing method, the method comprising:

acquiring a plurality of visual point images;
designating an area subjected to image processing;
setting an adjustable range of the image processing for each designated area; and
acquiring an adjustment value set in a range of the adjustable range for each area, performing image processing on image data based on the plurality of visual point images on the basis of the adjustment value, and generating a combination image,
wherein an adjustable range of an area other than the area subjected to the image processing is set smaller than an adjustable range of the area subjected to the image processing.

14. An image processing apparatus comprising:
a memory;
at least one processor, the processor executing the following functions in accordance with a program stored in the memory;
an acquisition unit configured to acquire a plurality of visual point images;
an image processing unit configured to perform image processing on image data based on the plurality of visual point images to generate a combination image;
a designation unit configured to designate an area subjected to the image processing using the image processing unit;
an adjustment unit configured to set an adjustable range of the image processing for each area designated by the designation unit; and
a user interface configured to designate an adjustment value by a user operation within the adjustable range,
wherein the image processing unit combines the plurality of visual point images to generate the combination image and determines an addition ratio of the plurality of visual point images for each area on the basis of the adjustment value designated in a range of the adjustable range set for each area.

15. An image processing method comprising:
acquiring a plurality of visual point images;
designating an area subjected to image processing;
setting an adjustable range of the image processing for each designated area;
acquiring an adjustment value set by a user operation in a range of the adjustable range for each area;
performing image processing on image data based on the plurality of visual point images on the basis of the adjustment value; and
generating a combination image by combining the plurality of visual point images in accordance with an addition ratio of the plurality of visual point images for each area on the basis of the adjustment value.

* * * * *